United States Patent
Sueki et al.

(10) Patent No.: US 10,276,119 B2
(45) Date of Patent: Apr. 30, 2019

(54) SHIFT REGISTER AND DISPLAY DEVICE PROVIDED THEREWITH

(71) Applicant: Sharp Kabushiki Kaisha, Sakai, Osaka (JP)

(72) Inventors: Toshitsugu Sueki, Sakai (JP); Yasuaki Iwase, Sakai (JP); Takuya Watanabe, Sakai (JP); Akira Tagawa, Sakai (JP); Kengo Hara, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 215 days.

(21) Appl. No.: 15/322,802

(22) PCT Filed: Jun. 26, 2015

(86) PCT No.: PCT/JP2015/068458
§ 371 (c)(1),
(2) Date: Dec. 29, 2016

(87) PCT Pub. No.: WO2016/002644
PCT Pub. Date: Jan. 7, 2016

(65) Prior Publication Data
US 2017/0140729 A1    May 18, 2017

(30) Foreign Application Priority Data
Jul. 4, 2014    (JP) ................. 2014-138686

(51) Int. Cl.
*G11C 19/00*    (2006.01)
*G09G 3/36*    (2006.01)
*G11C 19/28*    (2006.01)

(52) U.S. Cl.
CPC ........... *G09G 3/3677* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS

| | | | |
|---|---|---|---|
| 7,738,622 B2 * | 6/2010 | Cho .................. | G11C 19/28 377/64 |
| 8,477,094 B2 * | 7/2013 | Jung .................. | G11C 19/28 345/100 |

(Continued)

FOREIGN PATENT DOCUMENTS

| | | |
|---|---|---|
| WO | WO-2010/067641 A1 | 6/2010 |
| WO | WO-2011/055570 A1 | 5/2011 |

(Continued)

OTHER PUBLICATIONS

International Search Report PCT/ISA/210 for International Application No. PCT/JP2015/068458 dated Sep. 1, 2015.
(Continued)

*Primary Examiner* — Tuan T Lam
(74) *Attorney, Agent, or Firm* — ScienBiziP, P.C.

(57) ABSTRACT

An output control node stabilization portion includes a thin film transistor having a gate terminal to which is provided a fourth clock that changes to an on level at timing at which a scanning signal outputted from a previous stage is to change from an off level to an on level, a drain terminal connected to an output control node, and a source terminal to which the scanning signal outputted from the previous stage is provided; and a thin film transistor having a gate terminal to which is provided a third clock that changes to an on level at timing at which a scanning signal outputted from a subsequent stage is to change from an off level to an on level, a drain terminal connected to the output control node, and a source terminal to which the scanning signal outputted from the subsequent stage is provided.

12 Claims, 24 Drawing Sheets

(52) U.S. Cl.
CPC ............. *G09G 2300/0809* (2013.01); *G09G 2310/0286* (2013.01); *G09G 2310/08* (2013.01)

(56) References Cited

U.S. PATENT DOCUMENTS

| | | | | |
|---|---|---|---|---|
| 8,553,830 | B2* | 10/2013 | Jang | G11C 19/00 377/64 |
| 8,803,784 | B2* | 8/2014 | Sakamoto | G09G 3/3677 345/100 |
| 9,396,682 | B2* | 7/2016 | Xia | G09G 3/3266 |
| 9,459,473 | B2* | 10/2016 | Tseng | G02F 1/13306 |
| 2007/0297559 | A1 | 12/2007 | Cho et al. | |
| 2011/0199354 | A1 | 8/2011 | Iwase et al. | |
| 2012/0194489 | A1 | 8/2012 | Iwamoto et al. | |
| 2013/0016804 | A1 | 1/2013 | Ahn et al. | |
| 2014/0055333 | A1* | 2/2014 | Lin | G09G 3/3611 345/100 |
| 2015/0016584 | A1* | 1/2015 | Dun | G11C 27/04 377/68 |
| 2015/0187320 | A1* | 7/2015 | Ren | G09G 3/3696 345/87 |
| 2015/0187323 | A1* | 7/2015 | Jin | G09G 5/003 345/215 |
| 2015/0262703 | A1* | 9/2015 | Murakami | G09G 3/20 345/214 |
| 2015/0279480 | A1 | 10/2015 | Murakami et al. | |
| 2015/0279481 | A1 | 10/2015 | Sasaki et al. | |
| 2016/0276490 | A1* | 9/2016 | Umezaki | G09G 3/20 |
| 2016/0300623 | A1* | 10/2016 | Yang | G11C 19/28 |

FOREIGN PATENT DOCUMENTS

| | | |
|---|---|---|
| WO | WO-2014/054515 A1 | 4/2014 |
| WO | WO-2014/054516 A1 | 4/2014 |
| WO | WO-2014/054517 A1 | 4/2014 |
| WO | WO-2014/054518 A1 | 4/2014 |

OTHER PUBLICATIONS

Written Opinion of the International Searching Authority PCT/ISA/237 for International Application No. PCT/JP2015/068458 dated Sep. 1, 2015.

* cited by examiner

PRIOR ART

PRIOR ART

SHIFT REGISTER AND DISPLAY DEVICE PROVIDED THEREWITH

TECHNICAL FIELD

The present invention relates to an active matrix-type display device, and more particularly to a shift register in a scanning signal line drive circuit that drives scanning signal lines disposed in a display unit of an active matrix-type display device.

BACKGROUND ART

Conventionally, there is known an active matrix-type liquid crystal display device including a display unit that includes a plurality of source bus lines (video signal lines) and a plurality of gate bus lines (scanning signal lines). As for such a liquid crystal display device, conventionally, in many cases, a gate driver (scanning signal line drive circuit) for driving the gate bus lines is mounted, as an IC (Integrated Circuit) chip, on the periphery of substrates forming a liquid crystal panel. However, in recent years, forming the gate driver directly on a TFT substrate which is one of two glass substrates forming the liquid crystal panel has been gradually increasing. Such a gate driver is called "monolithic gate driver", etc.

Meanwhile, in the display unit of the active matrix-type liquid crystal display device, there are formed a plurality of source bus lines, a plurality of gate bus lines, and a plurality of pixel formation portions provided at the respective intersections of the plurality of source bus lines and the plurality of gate bus lines. The plurality of pixel formation portions are arranged in a matrix form and thereby form a pixel array. Each pixel formation portion includes, for example, a thin film transistor which is a switching element connected at its gate terminal to a gate bus line passing through a corresponding intersection and connected at its source terminal to a source bus line passing through the intersection; and a pixel capacitance for holding a pixel voltage value. The active matrix-type liquid crystal display device is also provided with the above-described gate driver and a source driver (video signal line drive circuit) for driving the source bus lines.

A video signal representing a pixel voltage value is transmitted by a source bus line. However, each source bus line cannot transmit video signals representing pixel voltage values for a plurality of rows at a time (simultaneously). Hence, writing (charging) of video signals to the pixel capacitances in the above-described pixel formation portions disposed in a matrix form is sequentially performed row by row. Hence, the gate driver is composed of a shift register including a plurality of stages so that the plurality of gate bus lines can be sequentially selected for a predetermined period. Then, by sequentially outputting active scanning signals from the respective stages of the shift register, writing of video signals to the pixel capacitances is sequentially performed row by row as described above. Note that, in this specification, a circuit that forms each stage of the shift register is referred to as "stage-forming circuit".

FIG. 24 is a circuit diagram of a conventional stage-forming circuit having the simplest configuration. The stage-forming circuit includes four thin film transistors T81 to T84 and one capacitor CAP. In addition, the stage-forming circuit has one output terminal 80 and four input terminals 81 to 84, in addition to input terminals for a low-level direct-current power supply potential VSS. A gate terminal of the thin film transistor T81, a source terminal of the thin film transistor T83, and a drain terminal of the thin film transistor T84 are connected to each other. A region where they are connected to each other is referred to as "output control node". The output control node is denoted by reference character NA. Note that in general one of a drain and a source with a higher potential is called a drain, but in the description of this specification, since one is defined as a drain and the other as a source, the source potential may be higher than the drain potential. In addition, the potential magnitude of the low-level direct-current power supply potential VSS is referred to as "VSS potential" for convenience sake.

A scanning signal GOUT to be provided to a gate bus line connected to this stage-forming circuit is outputted from the output terminal 80. A first clock CKA is provided to the input terminal 81. A second clock CKB is provided to the input terminal 82. Note that the first clock CKA and the second clock CKB are shifted in phase by 180 degrees relative to each other. A scanning signal outputted from a stage-forming circuit of the previous stage is provided to the input terminal 83, as a set signal S. A scanning signal outputted from a stage-forming circuit of the subsequent stage is provided to the input terminal 84, as a reset signal R. Note that in the following the "stage-forming circuit of the previous stage" may be simply briefly referred to as "previous stage", and the "stage-forming circuit of the subsequent stage" may be simply briefly referred to as "subsequent stage".

The thin film transistor T81 is connected at its gate terminal to the output control node NA, connected at its drain terminal to the input terminal 81, and connected at its source terminal to the output terminal 80. The thin film transistor T82 is connected at its gate terminal to the input terminal 82, connected at its drain terminal to the output terminal 80, and connected at its source terminal to the input terminal for the direct-current power supply potential VSS. The thin film transistor T83 is connected at its gate and drain terminals to the input terminal 83 (i.e., diode-connected) and connected at its source terminal to the output control node NA. The thin film transistor T84 is connected at its gate terminal to the input terminal 84, connected at its drain terminal to the output control node NA, and connected at its source terminal to the input terminal for the direct-current power supply potential VSS. The capacitor CAP is connected at its one end to the output control node NA and connected at its other end to the output terminal 80.

Next, with reference to FIG. 25, the operation of the stage-forming circuit having the configuration shown in FIG. 24 will be described. Note that in the following, as for each stage-forming circuit, a period during which operation for writing (charging) to pixel capacitances in pixel formation portions connected to a corresponding gate bus line is performed is referred to as "write operation period". Note also that periods other than the write operation period are referred to as "normal operation period". In FIG. 25, a period from time point t80 to time point t82 is a write operation period, and a period before time point t80 and a period after time point t82 are normal operation periods.

First, operation performed during the write operation period will be described. At time point t80, a pulse of the set signal S is provided to the input terminal 83. Since the thin film transistor T83 is diode-connected as shown in FIG. 24, the thin film transistor T83 goes into an on state by the pulse of the set signal S, and the capacitor CAP is charged. By this, the potential of the output control node NA increases and the thin film transistor T81 goes into an on state. Here, during a period from time point t80 to time point t81, the first clock CKA is at a low level. Hence, during this period, the scanning signal GOUT is maintained at a low level. In addition, during the period from time point t80 to time point t81, since the reset signal R is at a low level, the thin film transistor T84 is maintained in an off state. Hence, the potential of the output control node NA does not decrease during this period.

At time point t81, the first clock CKA changes from the low level to a high level. At this time, since the thin film transistor T81 is in the on state, the potential of the output terminal 80 increases with an increase in the potential of the input terminal 81. Here, since the capacitor CAP is provided between the output control node NA and the output terminal 80 as shown in FIG. 24, the potential of the output control node NA also increases with the increase in the potential of the output terminal 80 (the output control node NA is bootstrapped). As a result, a large voltage is applied to the gate terminal of the thin film transistor T81, and the potential of the scanning signal GOUT increases to the high-level potential of the first clock CKA. By this, the gate bus line connected to the output terminal 80 of this stage-forming circuit goes into a selected state. Note that during a period from time point t81 to time point t82, the second clock CKB is at a low level. Hence, since the thin film transistor T82 is maintained in an off state, the potential of the scanning signal GOUT does not decrease during this period.

At time point t82, the first clock CKA changes from the high level to the low level. By this, the potential of the output terminal 80 decreases with a decrease in the potential of the input terminal 81, and the potential of the output control node NA also decreases through the capacitor CAP. In addition, at time point t82, a pulse of the reset signal R is provided to the input terminal 84. By this, the thin film transistor T84 goes into an on state. As a result, the potential of the output control node NA changes from the high level to a low level. In addition, at time point t82, the second clock CKB changes from the low level to a high level. By this, the thin film transistor T82 goes into an on state. As a result, the potential of the scanning signal GOUT goes to the low level.

In the above-described manner, during the second half period of the write operation period, an active scanning signal GOUT is provided to the gate bus line corresponding to this stage-forming circuit is provided. A scanning signal GOUT outputted from a stage-forming circuit of any stage is provided to the subsequent stage, as a set signal S. By this, the plurality of gate bus lines provided to the liquid crystal display device sequentially go into a selected state, and writing to the pixel capacitances is performed row by row.

However, according to the above-described configuration, during the normal operation period, the potential of the scanning signal GOUT that is to be fixed at the low level may fluctuate due to noise caused by a clock signal (first clock CKA). This will be described below. A parasitic capacitance is formed between electrodes of the thin film transistor in a stage-forming circuit which forms the shift register. Therefore, in the configuration shown in FIG. 24, parasitic capacitances are formed between the gate and drain of the thin film transistor T81 and also between the gate and source of the thin film transistor T81. Hence, when the first clock CKA changes from the low level to the high level, the gate potential of the thin film transistor T81 increases through the parasitic capacitance. That is, despite the fact that the potential of the output control node NA is to be fixed at the low level, the potential of the output control node NA increases somewhat (the potential of the output control node NA floats). By this, a leakage current flows through the thin film transistor T81 and accordingly the potential of the scanning signal GOUT fluctuates. As can be grasped from FIG. 25, the first clock CKA changes from the low level to the high level in a predetermined cycle throughout an operation period of the liquid crystal display device. Therefore, the potential of the scanning signal GOUT fluctuates in a predetermined cycle during a normal operation period. As a result, abnormal operation or an increase in power consumption is caused.

In view of this, in general, the stage-forming circuit is provided with a circuit for maintaining the potential of the output control node NA at the low level throughout a normal operation period (hereinafter, referred to as "output control node stabilization portion"). FIG. 26 is a diagram schematically showing a configuration of a stage-forming circuit having an output control node stabilization portion. As shown in FIG. 26, the stage-forming circuit is provided with the output control node stabilization portion 950, in addition to a buffer 910, a scanning signal stabilization portion 920, an output control node setting portion 930, and an output control node resetting portion 940. Note that the thin film transistor T81, the thin film transistor T82, the thin film transistor T83, and the thin film transistor T84 in FIG. 24 correspond to the buffer 910, the scanning signal stabilization portion 920, the output control node setting portion 930, and the output control node resetting portion 940 in FIG. 26, respectively.

A specific configuration of a conventional stage-forming circuit having the output control node stabilization portion is disclosed in, for example, WO 2011/067641 A. FIG. 27 is a circuit diagram showing a configuration of a stage-forming circuit disclosed in WO 2011/067641 A. The stage-forming circuit shown in FIG. 27 includes 10 thin film transistors T91 to T100 and one capacitor CAP. In addition, the stage-forming circuit has one output terminal 90 and six input terminals 91 to 96. A gate terminal of the thin film transistor T91, a drain terminal of the thin film transistor T92, a source terminal of the thin film transistor T95, a gate terminal of the thin film transistor T96, and a drain terminal of the thin film transistor T97 are connected to each other through a first control node NA serving as an output control node. A gate terminal of the thin film transistor T92, a source terminal of the thin film transistor T93, a drain terminal of the thin film transistor T94, a drain terminal of the thin film transistor T96, and a gate terminal of the thin film transistor T100 are connected to each other. A region where they are connected to each other is referred to as "second control node". The second control node is denoted by reference character NB.

The thin film transistor T91 is connected at its gate terminal to the first control node NA, connected at its drain terminal to the input terminal 91, and connected at its source terminal to the output terminal 90. The thin film transistor T92 is connected at its gate terminal to the second control node NB, connected at its drain terminal to the first control node NA, and connected at its source terminal to an input terminal for the direct-current power supply potential VSS. The thin film transistor T93 is connected at its gate and drain terminals to the input terminal 93 (i.e., diode-connected) and connected at its source terminal to the second control node NB. The thin film transistor T94 is connected at its gate terminal to the input terminal 94, connected at its drain terminal to the second control node NB, and connected at its source terminal to an input terminal for the direct-current power supply potential VSS. The thin film transistor T95 is connected at its gate and drain terminals to the input terminal 95 (i.e., diode-connected) and connected at its source terminal to the first control node NA. The thin film transistor T96 is connected at its gate terminal to the first control node NA, connected at its drain terminal to the second control node NB, and connected at its source terminal to an input terminal for the direct-current power supply potential VSS. The thin film transistor T97 is connected at its gate terminal to the input terminal 96, connected at its drain terminal to the first control node NA, and connected at its source terminal to an input terminal for the direct-current power supply potential VSS. The thin film transistor T98 is connected at its gate terminal to the input terminal 96, connected at its drain terminal to the output terminal 90, and connected at its source terminal to an input terminal for the direct-current power supply potential VSS. The thin film transistor T99 is connected at its gate terminal to the input terminal 92, connected at its drain terminal to the output terminal 90, and connected at its source terminal to an input terminal for the direct-current power supply potential VSS. The thin film transistor T100 is connected at its gate terminal to the second control node NB, connected at its drain terminal to the output terminal 90, and connected at its source terminal to an input terminal for the direct-current power supply potential VSS. The capacitor CAP is connected at its one end to the output control node NA and connected at its other end to the output terminal 90. In a configuration such as that described above, the above-described output control node stabilization portion 950 is implemented by the thin film transistors T92, T93, T94, and T96.

FIG. 28 is a signal waveform diagram for describing the operation of the stage-forming circuit having the configuration shown in FIG. 27. As can be grasped from FIG. 28, the stage-forming circuit operates based on 4-phase clock signals (a first clock CKA, a second clock CKB, a third clock CKC, and a fourth clock CKD) which are shifted in phase by 90 degrees relative to each other. In FIG. 28, attention is focused on a normal operation period. During the normal operation period, since the potential of the first control node (output control node) NA is maintained at a low level, the thin film transistor T96 is maintained in an off state. In addition, during a period during which the third clock CKC is at a high level and the fourth clock CKD is at a low level, the thin film transistor T93 goes into an on state and the thin film transistor T94 goes into an off state. In addition, during a period during which the third clock CKC is at a low level and the fourth clock CKD is at a high level, the thin film transistor T93 goes into an off state and the thin film transistor T94 goes into an on state. By the above, as shown in FIG. 28, during the normal operation period, the potential of the second control node NB goes to a high level every predetermined period. By this, during the normal operation period, the thin film transistor T92 goes into an on state every predetermined period, and the potential of the first control node NA is drawn to the VSS potential. In the above-described manner, the potential of the output control node NA is prevented from floating during the normal operation period, implementing a monolithic gate driver that does not cause abnormal operation. Note that the thin film transistor T96 is provided in order to prevent the potential of the second control node NB from going to a high level during a write operation period.

PRIOR ART DOCUMENT

Patent Document

[Patent Document 1] WO 2010/067641 A

SUMMARY OF THE INVENTION

Problems to be Solved by the Invention

In recent years, there has been an increasing demand for miniaturization of a display device such as the above-described liquid crystal display device. Hence, to achieve miniaturization of a display device, a reduction in picture-frame is attempted. However, as can be grasped from FIG. 27, according to the conventional configuration, each stage-forming circuit forming the shift register includes many thin film transistors. Due to this, the area occupied by the gate driver on the TFT substrate increases, making it difficult to achieve a reduction in picture-frame. In addition, since the loads of thin film transistors connected to the output control node NA increase, reliability for long term operation decreases. Furthermore, during a period during which the third clock CKC is at a high level and the potential of the first control node NA is at a high level in FIG. 28, since both the thin film transistor T93 and the thin film transistor T96 go into an on state, a flow-through current flows through the thin film transistor T93 and the thin film transistor T96. As a result, power consumption increases. As described above, according to the conventional configuration, it is difficult to achieve a reduction in picture-frame and a reduction in power consumption and to ensure reliability for long term operation.

An object of the present invention is therefore to implement a shift register for driving scanning signal lines that is capable of achieving a reduction in picture-frame and a reduction in power consumption of a display device while ensuring reliability for long term operation.

Means for Solving the Problems

A first aspect of the present invention is directed to a shift register that includes a plurality of stages and drives scanning signal lines of a display device, each of the plurality of stages operating based on a plurality of clock signals, and each of the plurality of clock signals periodically repeating a first level and a second level, wherein a stage-forming circuit that forms each of the plurality of stages includes:
  an output node that outputs a scanning signal to a corresponding one of the scanning signal lines;
  a first output node stabilization switching element having a control terminal to which one of the plurality of clock signals is provided; a first conductive terminal connected to the output node; and a second conductive terminal to which an off-level power supply potential is provided, the one of the plurality of clock signals changing from an off level to an on level at timing at which the scanning signal outputted from the output node is to change from an on level to an off level;
  an output control switching element having a control terminal; a first conductive terminal to which one of the plurality of clock signals is provided; and a second conductive terminal connected to the output node, the one of the plurality of clock signals changing from an off level to an on level at timing at which the scanning signal outputted from the output node is to change from an off level to an on level;
  an output control node connected to the control terminal of the output control switching element;
  an output control node turn-on portion that receives, as a set signal, one of scanning signals outputted from output nodes of stages one or more stages before the stage, and changes a level of the output control node to an on level based on the set signal, the one of scanning signals changing from an off level to an on level at timing at which the output control node is to change from an off level to an on level;

an output control node turn-off portion that receives, as a reset signal, one of scanning signals outputted from output nodes of stages one or more stages after the stage, and changes the level of the output control node to an off level based on the reset signal, the one of scanning signals changing from an off level to an on level at timing at which the output control node is to change from an on level to an off level; and an output control node stabilization portion that prevents the level of the output control node from fluctuating during a period during which the level of the output control node is to be maintained at an off level, and the output control node stabilization portion includes:

a first output control node stabilization switching element having a control terminal to which one of the plurality of clock signals is provided; a first conductive terminal connected to the output control node; and a second conductive terminal to which a scanning signal outputted from an output node of a previous stage is provided, the one of the plurality of clock signals changing from an off level to an on level at timing at which the scanning signal outputted from the output node of the previous stage is to change from an off level to an on level; and a second output control node stabilization switching element having a control terminal to which one of the plurality of clock signals is provided; a first conductive terminal connected to the output control node directly or through another switching element; and a second conductive terminal to which a scanning signal outputted from an output node of a subsequent stage is provided, the one of the plurality of clock signals changing from an off level to an on level at timing at which the scanning signal outputted from the output node of the subsequent stage is to change from an off level to an on level.

According to a second aspect of the present invention, in the first aspect of the present invention, the output control node stabilization portion includes only the first output control node stabilization switching element and the second output control node stabilization switching element, and the first conductive terminal of the second output control node stabilization switching element is directly connected to the output control node.

According to a third aspect of the present invention, in the first aspect of the present invention, the output control node stabilization portion further includes a third output control node stabilization switching element having a control terminal to which the clock signal provided to the first conductive terminal of the output control switching element is provided; a first conductive terminal connected to the output control node; and a second conductive terminal connected to the first conductive terminal of the second output control node stabilization switching element.

According to a fourth aspect of the present invention, in the third aspect of the present invention, the output control node turn-on portion receives, as the set signal, a scanning signal outputted from an output node of a stage two stages before the stage.

According to a fifth aspect of the present invention, in the first aspect of the present invention, the output control node stabilization portion further includes a fourth output control node stabilization switching element having a control terminal to which an initialization signal is provided; a first conductive terminal connected to the output control node; and a second conductive terminal to which an off-level power supply potential is provided, the initialization signal changing from an off level to an on level immediately after a start of a vertical scanning period.

According to a sixth aspect of the present invention, in the first aspect of the present invention, the output control node stabilization portion further includes a fifth output control node stabilization switching element having a control terminal to which a clear signal is provided; a first conductive terminal connected to the output control node; and a second conductive terminal to which an off-level power supply potential is provided, the clear signal changing from an off level to an on level when a vertical scanning period ends.

According to a seventh aspect of the present invention, in the first aspect of the present invention, the stage-forming circuit further includes a second output node stabilization switching element having a control terminal to which a clear signal is provided; a first conductive terminal connected to the output node; and a second conductive terminal to which an off-level power supply potential is provided, the clear signal changing from an off level to an on level when a vertical scanning period ends.

According to an eighth aspect of the present invention, in the first aspect of the present invention, the stage-forming circuit further includes a second output node stabilization switching element having a control terminal to which a clear signal is provided; a first conductive terminal connected to the output node; and a second conductive terminal to which an off-level power supply potential is provided, the clear signal changing from an off level to an on level when a vertical scanning period ends, and the output control node stabilization portion further includes:

a third output control node stabilization switching element having a control terminal to which the clock signal provided to the first conductive terminal of the output control switching element is provided; a first conductive terminal connected to the output control node; and a second conductive terminal connected to the first conductive terminal of the second output control node stabilization switching element;

a fourth output control node stabilization switching element having a control terminal to which an initialization signal is provided; a first conductive terminal connected to the output control node; and a second conductive terminal to which an off-level power supply potential is provided, the initialization signal changing from an off level to an on level immediately after a start of a vertical scanning period; and a fifth output control node stabilization switching element having a control terminal to which a clear signal is provided; a first conductive terminal connected to the output control node; and a second conductive terminal to which an off-level power supply potential is provided, the clear signal changing from an off level to an on level when the vertical scanning period ends.

According to a ninth aspect of the present invention, in the first aspect of the present invention, the switching elements included in the stage-forming circuit are thin-film transistors including an oxide semiconductor.

According to a tenth aspect of the present invention, in the ninth aspect of the present invention, the oxide semiconductor is indium gallium zinc oxide.

An eleventh aspect of the present invention is directed to a display device including:

a display unit in which a plurality of scanning signal lines are arranged; and the shift register according to any one of the first to tenth aspects of the present invention, the shift register including a plurality of stages which are provided so as to have a one-to-one correspondence with the plurality of scanning signal lines.

Effects of the Invention

According to the first aspect of the present invention, each stage-forming circuit forming a shift register is provided with an output control node stabilization portion including two switching elements (a first output control node stabilization switching element having a control terminal to which is provided a clock signal that changes from an off level to an on level at timing at which a scanning signal outputted from the previous stage is to change from an off level to an on level, a first conductive terminal connected to an output control node, and a second conductive terminal to which the scanning signal outputted from the previous stage is provided; and a second output control node stabilization switching element having a control terminal to which is provided a clock signal that changes from an off level to an on level at timing at which a scanning signal outputted from the subsequent stage is to change from an off level to an on level, a first conductive terminal connected to the output control node directly or through another switching element, and a second conductive terminal to which the scanning signal outputted from the subsequent stage is provided). In such a configuration, during a normal operation period (a period other than a write operation period during which operation for writing (charging) to pixel capacitances in a row corresponding to each stage-forming circuit is performed), the first output control node stabilization switching element and the second output control node stabilization switching element alternately go into an on state with the potential of the second conductive terminal of the first output control node stabilization switching element and the potential of the second conductive terminal of the second output control node stabilization switching element being at an off level. By this, during the normal operation period, even when noise caused by the clock operation of a clock signal is mixed in the output control node, the potential of the output control node is drawn to a sufficient off level. As described above, the output control node stabilization portion for maintaining the potential of the output control node at an off level throughout the normal operation period is implemented using a smaller number of switching elements than in conventional cases. Hence, in a display device using this shift register, the area occupied by a scanning signal line drive circuit on a panel substrate can be reduced, enabling to achieve a reduction in picture-frame over conventional cases. In addition, since the number of switching elements forming the output control node stabilization portion is reduced, the loads of switching elements connected to the output control node are reduced, and accordingly, reliability for long term operation improves over conventional cases. Furthermore, unlike the conventional configuration, a flow-through current does not flow through the switching elements. Hence, power consumption is reduced over conventional cases. By the above, by using this shift register for a scanning signal line drive circuit in a display device, a reduction in picture-frame and a reduction in power consumption of the display device can be achieved while ensuring reliability for long term operation.

According to the second aspect of the present invention, the output control node stabilization portion is implemented using only two switching elements. Hence, by using this shift register for a scanning signal line drive circuit in a display device, the area occupied by the scanning signal line drive circuit on a panel substrate can be significantly reduced, enabling to achieve a significant reduction in picture-frame over conventional cases. In addition, the loads of switching elements connected to the output control node are significantly reduced, and accordingly, reliability for long term operation significantly improves over conventional cases.

According to the third aspect of the present invention, the second conductive terminal of the second output control node stabilization switching element is electrically connected to the output control node when both the second output control node stabilization switching element and the third output control node stabilization switching element are in an on state. If a clock signal provided to the control terminal of the third output control node stabilization switching element is at an off level even when a clock signal provided to the control terminal of the second output control node stabilization switching element is at an on level, then the third output control node stabilization switching element goes into an off state, and thus, the second conductive terminal of the second output control node stabilization switching element and the output control node are maintained in a state of being electrically disconnected from each other. Since the stage-forming circuit has such a configuration, a period for precharging the output control node can be increased. By this, reliability for long term operation improves.

According to the fourth aspect of the present invention, since the output control node changes from an off level to an on level based on a scanning signal outputted from an output node of a stage two stages before the stage, the effect of the third aspect of the present invention can be securely attained.

According to the fifth aspect of the present invention, in each stage-forming circuit, even when noise is mixed in the output control node due to a rise of a clock signal provided to the first conductive terminal of the output control switching element immediately after the start of a vertical scanning period, the potential of the output control node is drawn to an off-level power supply potential by the fourth output control node stabilization switching element going into an on state. By this, the occurrence of abnormal operation caused by the clock operation, which is performed immediately after the start of the vertical scanning period, of the clock signal provided to the first conductive terminal of the output control switching element is suppressed.

According to the sixth aspect of the present invention, in each stage-forming circuit, when a vertical scanning period ends, the potential of the output control node is drawn to an off-level power supply potential by the fifth output control node stabilization switching element going into an on state. By this, the state of the output control node in each stage-forming circuit is cleared every frame, improving reliability.

According to the seventh aspect of the present invention, in each stage-forming circuit, when a vertical scanning period ends, the potential of the output node is drawn to an off-level power supply potential by the second output node stabilization switching element going into an on state. By this, the state of the output node in each stage-forming circuit is cleared every frame, improving reliability.

According to the eighth aspect of the present invention, the occurrence of abnormal operation caused by clock operation performed immediately after the start of a vertical scanning period is suppressed, and reliability for long term operation improves.

According to the ninth aspect of the present invention, thin film transistors including an oxide semiconductor are used. Since the oxide semiconductor has high mobility, a further reduction in picture-frame of a display device is possible.

According to the tenth aspect of the present invention, since indium gallium zinc oxide is used as the oxide semiconductor, the effect of the ninth aspect of the present invention can be securely attained.

According to the eleventh aspect of the present invention, a display device including a shift register is implemented, with which the same effects as those of any of the first to tenth aspects of the present invention can be obtained.

MODES FOR CARRYING OUT THE INVENTION

Embodiments of the present invention will be described below with reference to the accompanying drawings. Note that in the following description, a gate terminal (a gate electrode) of a thin film transistor corresponds to a control electrode, a drain terminal (a drain electrode) corresponds to a first conductive terminal, and a source terminal (a source electrode) corresponds to a second conductive terminal. Note also that description is made assuming that all thin film transistors provided in a shift register are n-channel thin film transistors.

1. First Embodiment

<1.1 Overall Configuration and Operation

Figure 2:
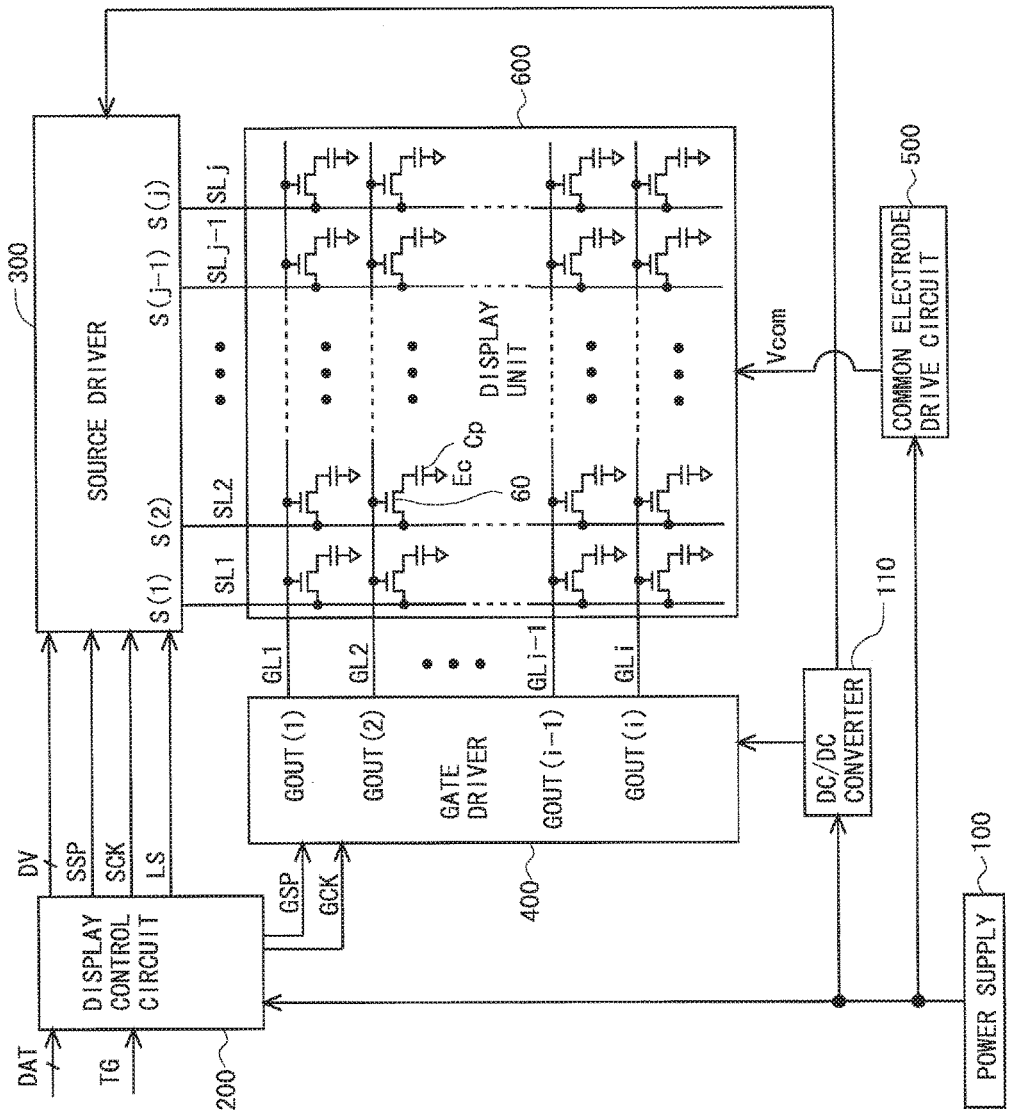
FIG. 2 is a block diagram showing an overall configuration of an active matrix-type liquid crystal display device according to the first embodiment.

FIG. 2 is a block diagram showing an overall configuration of an active matrix-type liquid crystal display device according to a first embodiment of the present invention. As shown in FIG. 2, the liquid crystal display device includes a power supply 100, a DC/DC converter 110, a display control circuit 200, a source driver (video signal line drive circuit) 300, a gate driver (scanning signal line drive circuit) 400, a common electrode drive circuit 500, and a display unit 600. Note that, in the present embodiment, the gate driver 400 and the display unit 600 are formed on the same substrate (a TFT substrate which is one of two substrates forming a liquid crystal panel).

In the display unit 600 there are formed a plurality of (j) source bus lines (video signal lines) SL1 to SLj; a plurality of (i) gate bus lines (scanning signal lines) GL1 to GLi; and a plurality of (i×j) pixel formation portions provided at the respective intersections of the plurality of source bus lines SL1 to SLj and the plurality of gate bus lines GL1 to GLi.

The plurality of pixel formation portions are disposed in a matrix form and thereby form a pixel array. Each pixel formation portion includes a thin film transistor (TFT) 60 which is a switching element connected at its gate terminal to a gate bus line passing through a corresponding intersection, and connected at its source terminal to a source bus line passing through the intersection; a pixel electrode connected to a drain terminal of the thin film transistor 60; a common electrode Ec which is a counter electrode provided so as to be shared by the plurality of pixel formation portions; and a liquid crystal layer provided so as to be shared by the plurality of pixel formation portions, and sandwiched between the pixel electrode and the common electrode Ec. By a liquid crystal capacitance formed by the pixel electrode and the common electrode Ec, a pixel capacitance Cp is formed. Note that although normally an auxiliary capacitance is provided in parallel with the liquid crystal capacitance so as to securely hold a charge in the pixel capacitance Cp, since the auxiliary capacitance is not directly related to the present invention, the description and depiction thereof are omitted.

Meanwhile, for the thin film transistor 60, for example, an oxide TFT (a thin film transistor using an oxide semiconductor for a channel layer) can be adopted. Examples of the oxide TFT include a thin film transistor including InGaZnO (indium gallium zinc oxide). Note, however, that the present invention is not limited thereto. For example, a thin film transistor using amorphous silicon for a channel layer can also be adopted.

The power supply 100 supplies a predetermined power supply voltage to the DC/DC converter 110, the display control circuit 200, and the common electrode drive circuit 500. The DC/DC converter 110 generates, from the power supply voltage, a predetermined direct-current voltage for allowing the source driver 300 and the gate driver 400 to operate, and supplies the predetermined direct-current voltage to the source driver 300 and the gate driver 400. The common electrode drive circuit 500 provides a predetermined potential Vcom to the common electrode Ec.

The display control circuit 200 receives an image signal DAT and a timing signal group TG such as a horizontal synchronizing signal and a vertical synchronizing signal which are transmitted from an external source, and outputs a digital video signal DV, and a source start pulse signal SSP, a source clock signal SCK, a latch strobe signal LS, a gate start pulse signal GSP, and gate clock signals GCK which are for controlling image display on the display unit 600. Note that, in the present embodiment, the gate clock signals GCK include 4-phase clock signals (a first gate clock signal GCK1 to a fourth gate clock signal GCK4).

The source driver 300 receives the digital video signal DV, the source start pulse signal SSP, the source clock signal SCK, and the latch strobe signal LS which are outputted from the display control circuit 200, and applies driving video signals S(1) to S(j) to the source bus lines SL1 to SLj, respectively.

The gate driver 400 repeats application of active scanning signals GOUT(1) to GOUT(i) to the gate bus lines GL1 to GLi, based on the gate start pulse signal GSP and the gate clock signals GCK which are outputted from the display control circuit 200, with one vertical scanning period being a cycle. Note that, in the following, when i scanning signals GOUT(1) to GOUT(i) do not need to be distinguished from each other, the scanning signals are simply represented by reference character GOUT. A detailed description of the gate driver 400 will be made later.

By applying the driving video signals S(1) to S(j) to the source bus lines SL1 to SLj and applying the scanning signals GOUT(1) to GOUT(i) to the gate bus lines GL1 to GLi in the above-described manner, an image based on the image signal DAT transmitted from the external source is displayed on the display unit 600.

<1.2 Configuration and Operation of the Gate Driver>

Figure 3:
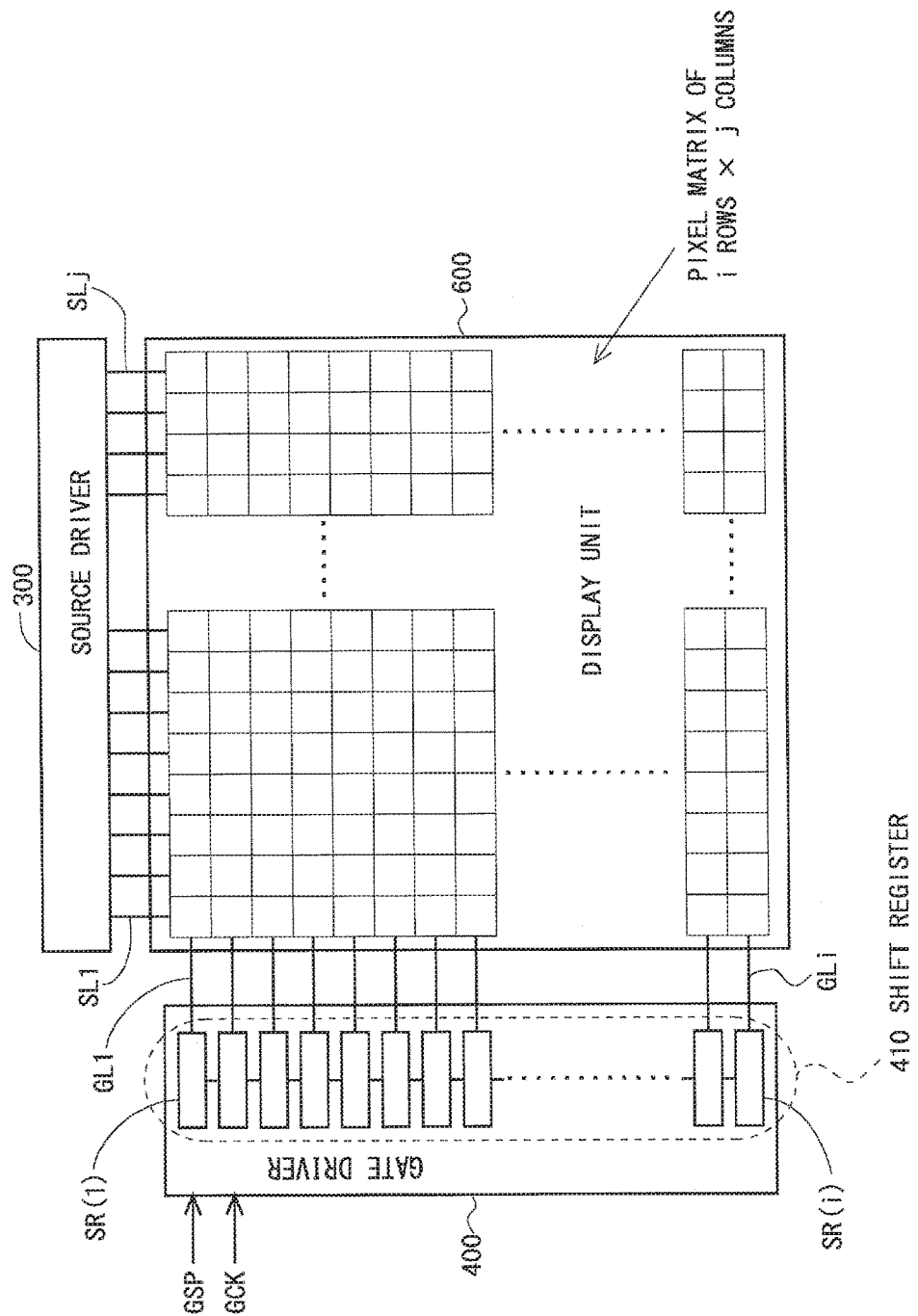
FIG. 3 is a block diagram for describing a configuration of a gate driver in the first embodiment.

Next, with reference to FIGS. 3 to 9, a summary of the configuration and operation of the gate driver 400 in the present embodiment will be described. As shown in FIG. 3, the gate driver 400 is composed of a shift register 410 including a plurality of stages. The display unit 600 has a pixel matrix of i rows×j columns formed therein, and the stages of the shift register 410 are provided so as to have a one-to-one correspondence with the rows of the pixel matrix. That is, the shift register 410 includes i stage-forming circuits SR(1) to SR(i). The i stage-forming circuits SR(1) to SR(i) are connected in series with each other.

Figure 4:
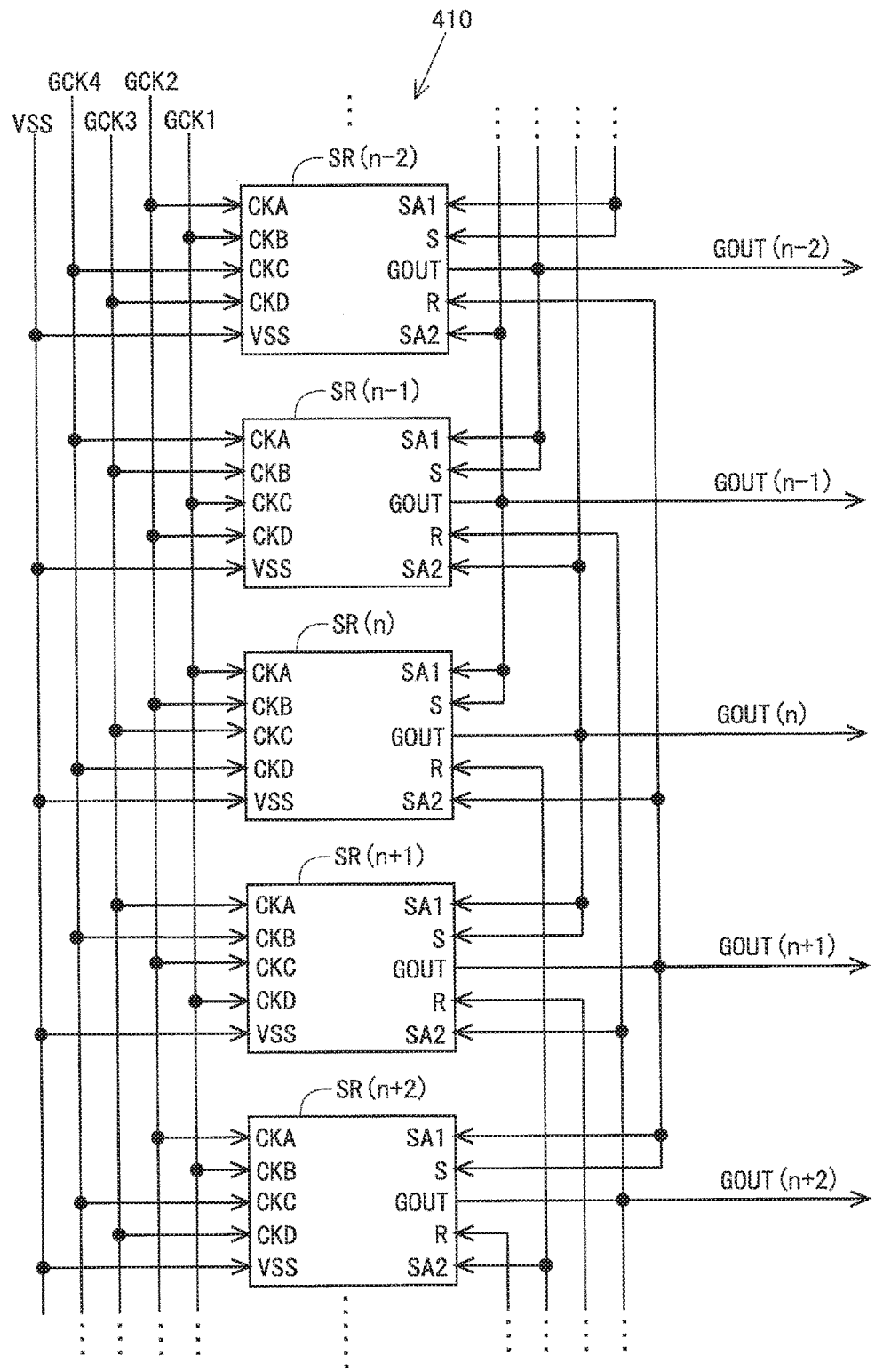
FIG. 4 is a block diagram showing a configuration of the shift register in the gate driver in the first embodiment.

FIG. 4 is a block diagram showing a configuration of the shift register 410 in the gate driver 400. As described above, the shift register 410 is composed of the i stage-forming circuits SR(1) to SR(i). Note that FIG. 4 shows stage-forming circuits SR(n−2) to SR(n+2) of an (n−2)th stage to an (n+2)th stage. In the following, when the i stage-forming circuits SR(1) to SR(i) do not need to be distinguished from each other, the stage-forming circuits are simply represented by reference character SR.

Figure 5:
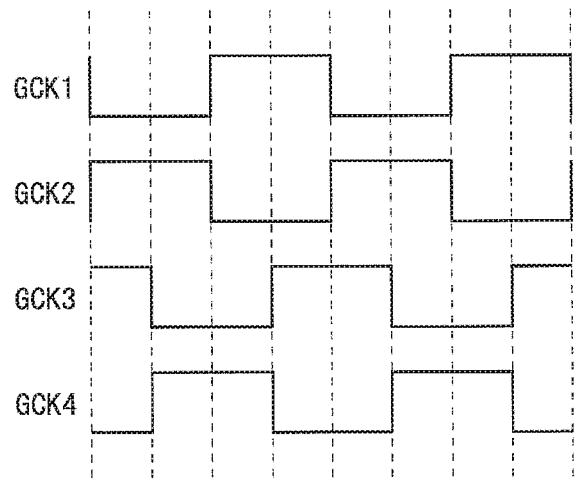
FIG. 5 is a signal waveform diagram of gate clock signals provided to each stage (each stage-forming circuit) of the shift register in the first embodiment.

Each stage-forming circuit SR is provided with an input terminal for receiving a clock signal CKA (hereinafter, referred to as "first clock"); an input terminal for receiving a clock signal CKB (hereinafter, referred to as "second clock"); an input terminal for receiving a clock signal CKC (hereinafter, referred to as "third clock"); an input terminal for receiving a clock signal CKD (hereinafter, referred to as "fourth clock"); an input terminal for receiving a low-level direct-current power supply potential VSS; an input terminal for receiving a set signal S; an input terminal for receiving a reset signal R; an input terminal for receiving a first control signal SA1; an input terminal for receiving a second control signal SA2; and an output terminal for outputting a scanning signal GOUT. The first to fourth gate clock signals GCK1 to GCK4 having waveforms such as those shown in FIG. 5 are provided to each stage (each stage-forming circuit) of the shift register 410. The first to fourth gate clock signals GCK1 to GCK4 are, as shown in FIG. 5, shifted in phase by 90 degrees relative to each other. For the stage-forming circuit SR(n−2) of the (n−2)th stage, the second gate clock signal GCK2 is provided as the first clock CKA, the first gate clock signal GCK1 is provided as the second clock CKB, the fourth gate clock signal GCK4 is provided as the third clock CKC, and the third gate clock signal GCK3 is provided as the fourth clock CKD. For the stage-forming circuit SR(n−1) of the (n−1)th stage, the fourth gate clock signal GCK4 is provided as the first clock CKA, the third gate clock signal GCK3 is provided as the second clock CKB, the first gate clock signal GCK1 is provided as the third clock CKC, and the second gate clock signal GCK2 is provided as the fourth clock CKD. For the stage-forming circuit SR(n) of the nth stage, the first gate clock signal GCK1 is provided as the first clock CKA, the second gate clock signal GCK2 is provided as the second clock CKB, the third gate clock signal GCK3 is provided as the third clock CKC, and the fourth gate clock signal GCK4 is provided as the fourth clock CKD. For the stage-forming circuit SR (n+1) of the (n+1)th stage, the third gate clock signal GCK3 is provided as the first clock CKA, the fourth gate clock signal GCK4 is provided as the second clock CKB, the second gate clock signal GCK2 is provided as the third clock CKC, and the first gate clock signal GCK1 is provided as the fourth clock CKD. Throughout all stages of the shift register 410, the same configurations as those of the (n−2)th stage to the (n+1)th stage are repeated every four stages. Note that the low-level direct-current power supply potential VSS is provided to all stage-forming circuits SR(1) to SR(i) in a shared manner.

Figure 6:
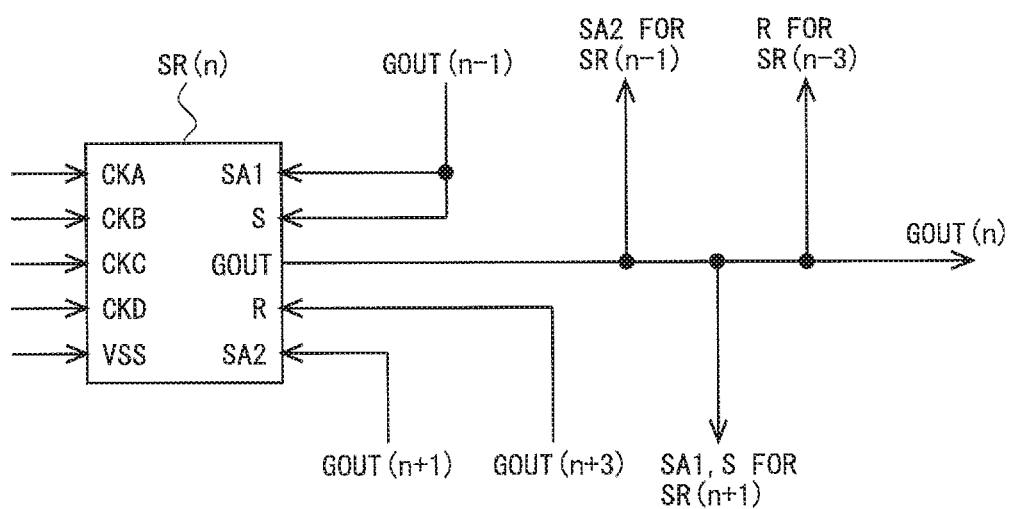
FIG. 6 is a diagram for describing input and output signals to/from a stage-forming circuit of an nth stage of the shift register in the first embodiment.

In addition, as shown in FIG. 6, for any stage (here, the nth stage), a scanning signal GOUT(n−1) outputted from the previous stage SR(n−1) is provided as the first control signal SA1 and the set signal S, a scanning signal GOUT(n+1) outputted from the subsequent stage SR(n+1) is provided as the second control signal SA2, and a scanning signal GOUT (n+3) outputted from a stage SR(n+3) three stages after the nth stage is provided as the reset signal R. Note, however, that for the first stage, the gate start pulse signal GSP is provided as the first control signal SA1 and the set signal S.

In addition, as shown in FIG. 6, a scanning signal GOUT (n) outputted from any stage (here, the nth stage) is provided to a stage SR(n−3) three stages before the nth stage as the reset signal R, provided to the previous stage SR(n−1) as the second control signal SA2, and provided to the subsequent stage SR(n+1) as the first control signal SA1 and the set signal S, in addition to being provided to a corresponding gate bus line.

Figure 7:
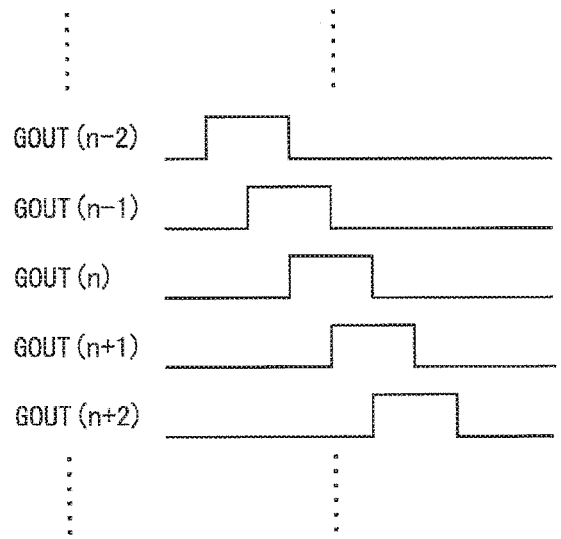
FIG. 7 is a signal waveform diagram of scanning signals provided to gate bus lines in the first embodiment.

In a configuration such as that described above, when a pulse of the gate start pulse signal GSP serving as the first control signal SA1 and as the set signal S is provided to the stage-forming circuit SR(1) of the first stage of the shift register 410, shift pulses included in scanning signals GOUT which are outputted from the respective stage-forming circuits SR are sequentially transferred from the stage-forming circuit SR(1) of the first stage to the stage-forming circuit SR(i) of the ith stage, based on the clock operation of the gate clock signals GCK (the first to fourth gate clock signals GCK1 to GCK4). Then, according to the shift pulse transfer, the scanning signals GOUT outputted from the respective stage-forming circuits SR sequentially go to a high level. By this, scanning signals GOUT having waveforms such as those shown in FIG. 7 are provided to the gate bus lines in the display unit 600.

Figure 8:
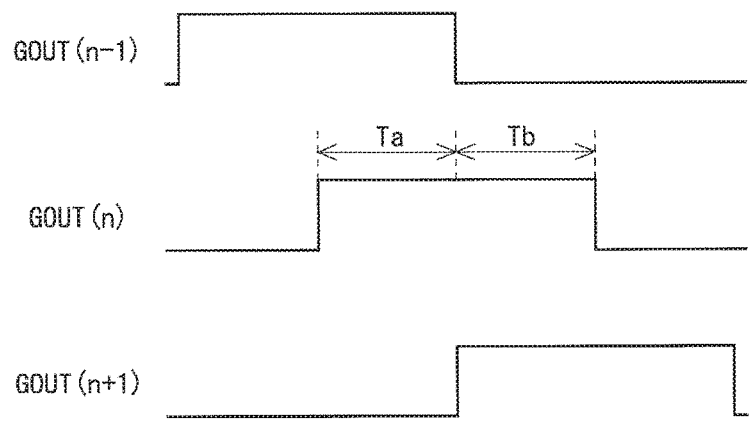
FIG. 8 is a diagram for describing a period during which a scanning signal is at a high level in the first embodiment.
Figure 9:
FIG. 9 is a diagram for describing a rise of a scanning signal in the first embodiment.

Meanwhile, focusing on the scanning signal GOUT(n) outputted from any stage (here, the nth stage), as shown in FIG. 8, during the first half period Ta of a period during which the scanning signal GOUT(n) is at the high level, the scanning signal GOUT(n−1) outputted from the previous stage is also at the high level, and during the second half period Tb of the period during which the scanning signal GOUT(n) is at the high level, the scanning signal GOUT (n+1) outputted from the subsequent stage is also at the high level. Regarding this, in a row to which the scanning signal GOUT(n) is provided, preliminary charging for pixel capacitances is performed during the first half period Ta, and main charging for the pixel capacitances is performed during the second half period Tb. By this, sufficient charge time is ensured, suppressing a reduction in display quality caused by insufficient charging for the pixel capacitances. In addition, even when the scanning signal GOUT has a slow rise (even when waveform rounding occurs at the rise of the scanning signal GOUT) as shown in FIG. 9, a sufficient charge period can be ensured.

<1.3 Configuration of the Stage-Forming Circuit>

Figure 1:
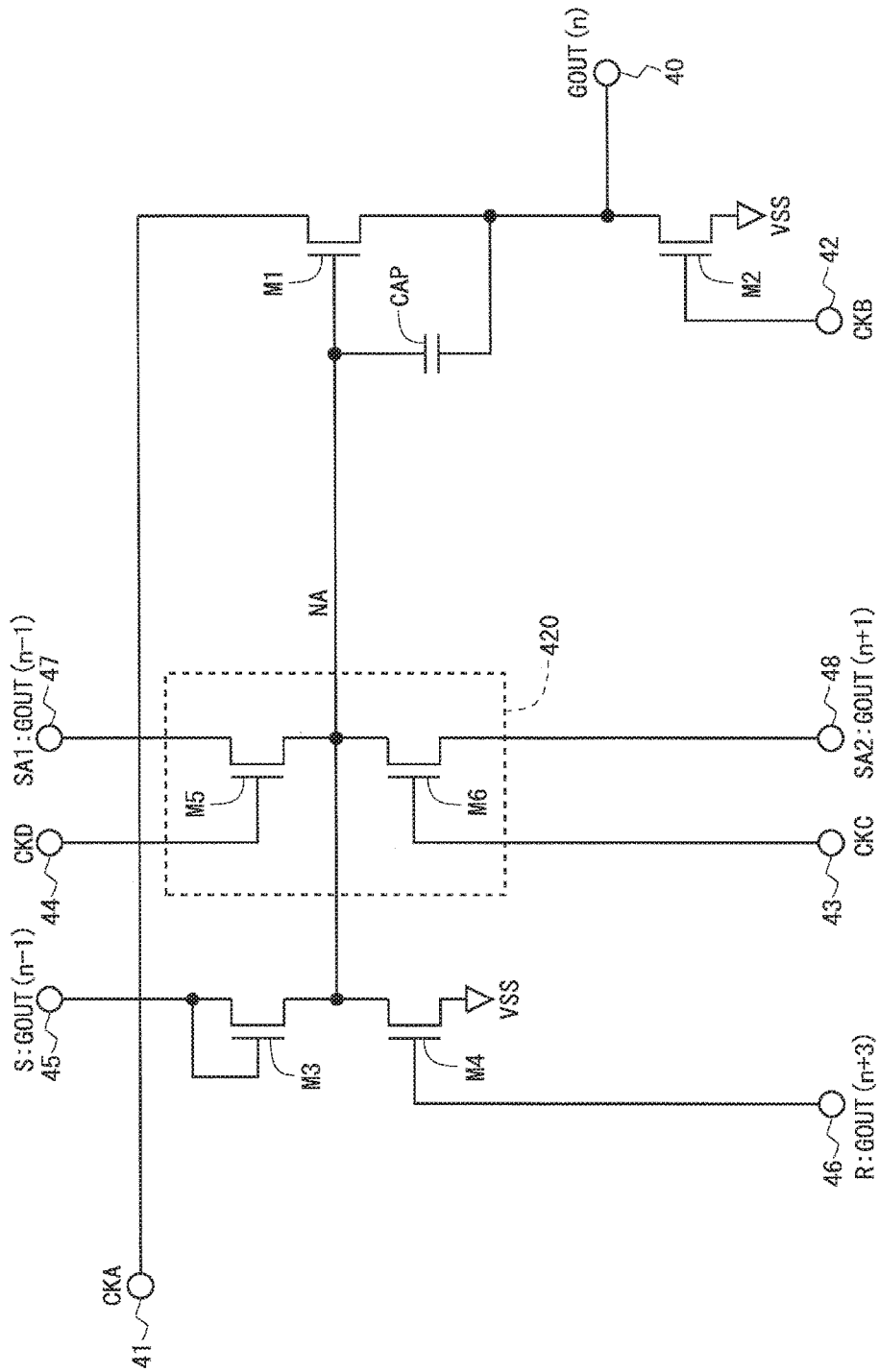
FIG. 1 is a circuit diagram showing a configuration of a stage-forming circuit (a configuration of a portion of a shift register for one stage) of a liquid crystal display device according to a first embodiment of the present invention.

FIG. 1 is a circuit diagram showing a configuration of a stage-forming circuit SR (a configuration of a portion of the shift register 410 for one stage) in the present embodiment. As shown in FIG. 1, the stage-forming circuit SR includes six thin film transistors M1 to M6 and one capacitor CAP. In addition, the stage-forming circuit SR has one output terminal (output node) 40 and eight input terminals 41 to 48, in addition to input terminals for the low-level direct-current power supply potential VSS. Here, the input terminal that receives the first clock CKA is denoted by reference character 41, the input terminal that receives the second clock CKB is denoted by reference character 42, the input terminal that receives the third clock CKC is denoted by reference character 43, and the input terminal that receives the fourth clock CKD is denoted by reference character 44. In addition, the input terminal that receives the set signal S is denoted by reference character 45, the input terminal that receives the reset signal R is denoted by reference character 46, the input terminal that receives the first control signal SA1 is denoted by reference character 47, and the input terminal that receives the second control signal SA2 is denoted by reference character 48. The output terminal 40 is a terminal for outputting the scanning signal GOUT. Note that the thin film transistors M1 to M6 of the stage-forming circuit SR are implemented by thin film transistors of the same type as the thin film transistors 60 in the above-described pixel formation portions (see FIG. 2) (e.g., thin film transistors including InGaZnO).

Next, a connection relationship between the components in the stage-forming circuit SR will be described. A gate terminal of the thin film transistor M1, a source terminal of the thin film transistor M3, a drain terminal of the thin film transistor M4, a drain terminal of the thin film transistor M5, a drain terminal of the thin film transistor M6, and one end of the capacitor CAP are connected to each other through an output control node NA.

The thin film transistor M1 is connected at its gate terminal to the output control node NA, connected at its drain terminal to the input terminal 41, and connected at its source terminal to the output terminal 40. The thin film transistor M2 is connected at its gate terminal to the input terminal 42, connected at its drain terminal to the output terminal 40, and connected at its source terminal to the input terminal for the direct-current power supply potential VSS. The thin film transistor M3 is connected at its gate and drain terminals to the input terminal 45 (i.e., diode-connected) and connected at its source terminal to the output control node NA. The thin film transistor M4 is connected at its gate terminal to the input terminal 46, connected at its drain terminal to the output control node NA, and connected at its source terminal to the input terminal for the direct-current power supply potential VSS. The thin film transistor M5 is connected at its gate terminal to the input terminal 44, connected at its drain terminal to the output control node NA, and connected at its source terminal to the input terminal 47. The thin film transistor M6 is connected at its gate terminal to the input terminal 43, connected at its drain terminal to the output control node NA, and connected at its source terminal to the input terminal 48. The capacitor CAP is connected at its one end to the output control node NA and connected at its other end to the output terminal 40.

Next, the functions in the stage-forming circuit SR of the components will be described. The thin film transistor M1 provides the potential of the first clock CKA to the output terminal 40 when the potential of the output control node NA is at a high level. The thin film transistor M2 changes the potential of the output terminal 40 (the potential of the scanning signal GOUT) to the VSS potential when the second clock CKB is at a high level. The thin film transistor M3 changes the potential of the output control node NA to a high level when the set signal S is at a high level. The thin film transistor M4 changes the potential of the output control node NA to the VSS potential when the reset signal R is at a high level. The thin film transistor M5 changes, during a normal operation period, the potential of the output control node NA to the VSS potential when the fourth clock CKD is at a high level. The thin film transistor M6 changes, during the normal operation period, the potential of the output control node NA to the VSS potential when the third clock CKC is at a high level. The capacitor CAP functions as an auxiliary capacitance for maintaining the potential of the output control node NA at a high level during a write operation period.

Note that, in the present embodiment, an output control switching element is implemented by the thin film transistor M1, and a first output node stabilization switching element is implemented by the thin film transistor M2. Note also that an output control node turn-on portion is implemented by the thin film transistor M3, and an output control node turn-off portion is implemented by the thin film transistor M4. Note also that an output control node stabilization portion 420 is implemented by the thin film transistor M5 and the thin film transistor M6.

<1.4 Operation of the Stage-Forming Circuit>

Figure 10:
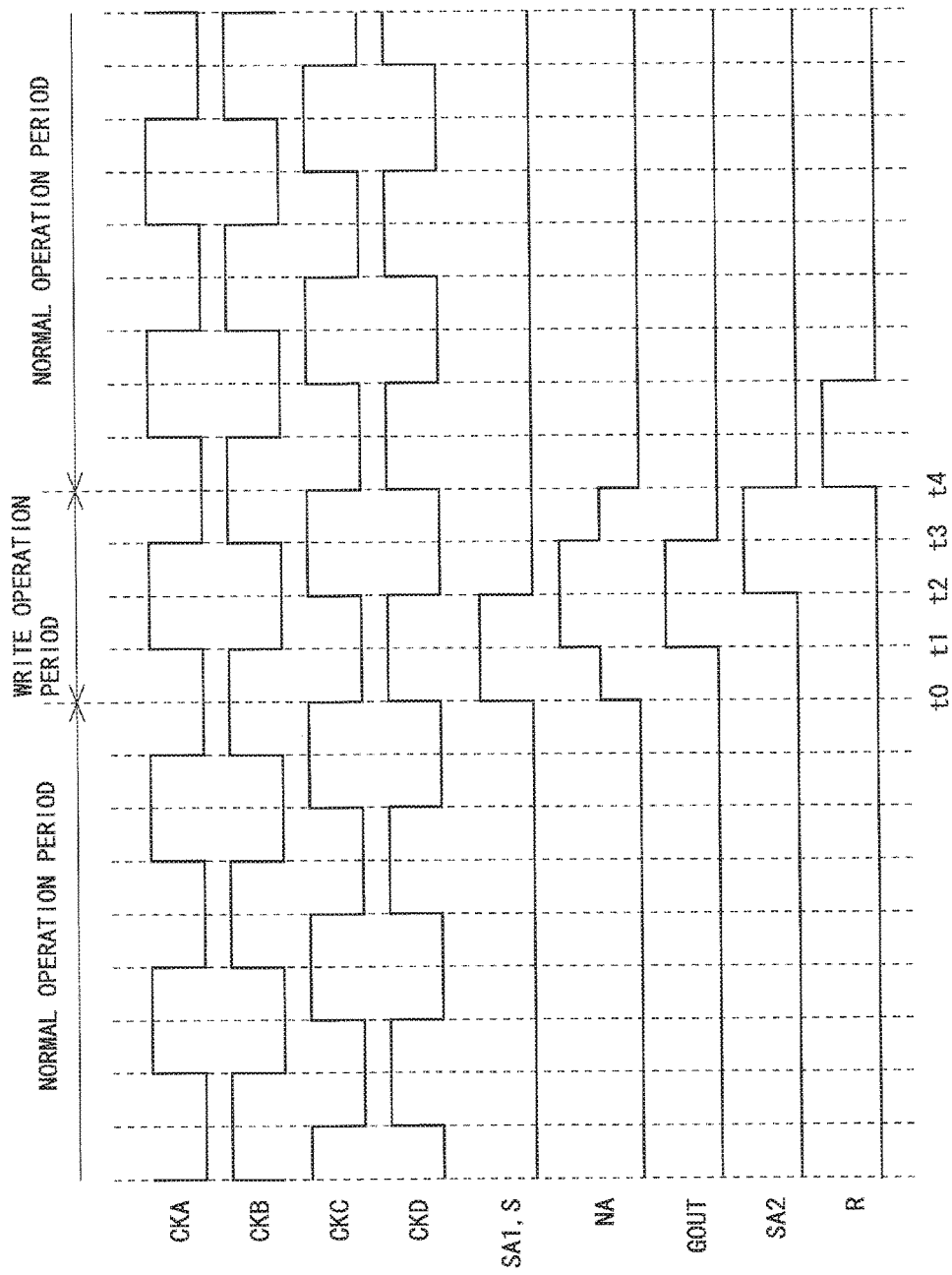
FIG. 10 is a signal waveform diagram for an overall operation period of the liquid crystal display device in the first embodiment.
Figure 11:
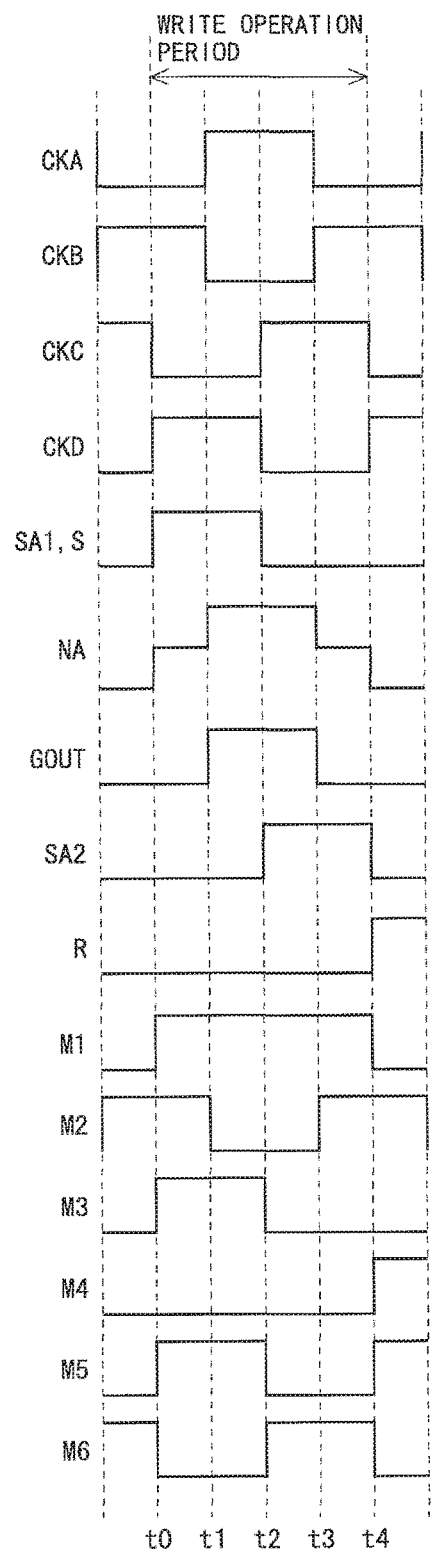
FIG. 11 is a signal waveform diagram for describing operation performed during a write operation period in the first embodiment.

Next, the operation of the stage-forming circuit SR in the present embodiment will be described. First, with reference to FIGS. 1, 10, and 11, operation performed during a write operation period will be described. FIG. 10 is a signal waveform diagram for an overall operation period of the liquid crystal display device. FIG. 11 is a signal waveform diagram for describing operation performed during a write operation period. Note that the waveforms of M1 to M6 in FIG. 11 show whether the thin film transistors M1 to M6 are in an on state or an off state.

At time point t0, the set signal S changes from a low level to a high level. Since the thin film transistor M3 is diode-connected as shown in FIG. 1, the thin film transistor M3 goes into an on state by a pulse of the set signal S. In addition, at time point t0, the fourth clock CKD changes from a low level to a high level. By this, the thin film transistor M5 goes into an on state. At this time, the first control signal SA1 is at a high level. By the above, at time point t0, the potential of the output control node NA increases and the thin film transistor M1 goes into an on state. Here, during a period from time point t0 to time point t1, the reset signal R and the third clock CKC are at a low level. Hence, during this period, the thin film transistor M4 and the thin film transistor M6 are maintained in an off state. Therefore, the potential of the output control node NA does not decrease during this period.

At time point t1, the first clock CKA changes from a low level to a high level. At this time, since the thin film transistor M1 is in the on state, with an increase in the potential of the input terminal 41, the potential of the output terminal 40 also increases. Here, since the capacitor CAP is provided between the output control node NA and the output terminal 40 as shown in FIG. 1, with the increase in the potential of the output terminal 40, the potential of the output control node NA also increases (the output control node NA is bootstrapped). As a result, a large voltage is applied to the gate terminal of the thin film transistor M1, and the potential of the scanning signal GOUT increases to a level sufficient for a gate bus line connected to the output terminal 40 of this stage-forming circuit SR to go into a selected state. Here, during a period from time point t1 to time point t3, since the second clock CKB is at a low level, the thin film transistor M2 is maintained in an off state. Therefore, the potential of the scanning signal GOUT does not decrease during this period. In addition, during the period from time point t1 to time point t3, since the reset signal R is at a low level, the thin film transistor M4 is maintained in the off state. Therefore, the potential of the output control node NA does not decrease during this period.

Meanwhile, during a period from time point t1 to time point t2, since the fourth clock CKD is at the high level, the thin film transistor M5 is in an on state. However, during this period, since the first control signal SA1 (a scanning signal outputted from the previous stage) is at the high level, a decrease in the potential of the output control node NA due to the thin film transistor M5 being in the on state does not occur. In addition, during a period from time point t2 to time point t3, since the third clock CKC is at a high level, the thin film transistor M6 is in an on state. However, during this period, since the second control signal SA2 (a scanning signal outputted from the subsequent stage) is at a high level, a decrease in the potential of the output control node NA due to the thin film transistor M6 being in the on state does not occur.

At time point t3, the first clock CKA changes from the high level to the low level. By this, the potential of the output terminal 40 decreases with a decrease in the potential of the input terminal 41. When the potential of the output terminal 40 decreases, the potential of the output control node NA also decreases through the capacitor CAP. In addition, at time point t3, the second clock CKB changes from the low level to a high level. By this, the thin film transistor M2 goes into an on state. As a result, the potential of the scanning signal GOUT goes to a low level.

At time point t4, the reset signal R changes from the low level to a high level. By this, the thin film transistor M4 goes into an on state. In addition, at time point t4, the fourth clock CKD changes from the low level to the high level. By this, the thin film transistor M5 goes into the on state. At this time, the first control signal SA1 is at a low level. By the above, at time point t4, the potential of the output control node NA goes to a low level.

By each stage-forming circuit SR performing operation such as that described above, the plurality of gate bus lines GL1 to GLi provided to the liquid crystal display device sequentially go into a selected state, and writing to the pixel capacitances is performed row by row.

Figure 12:
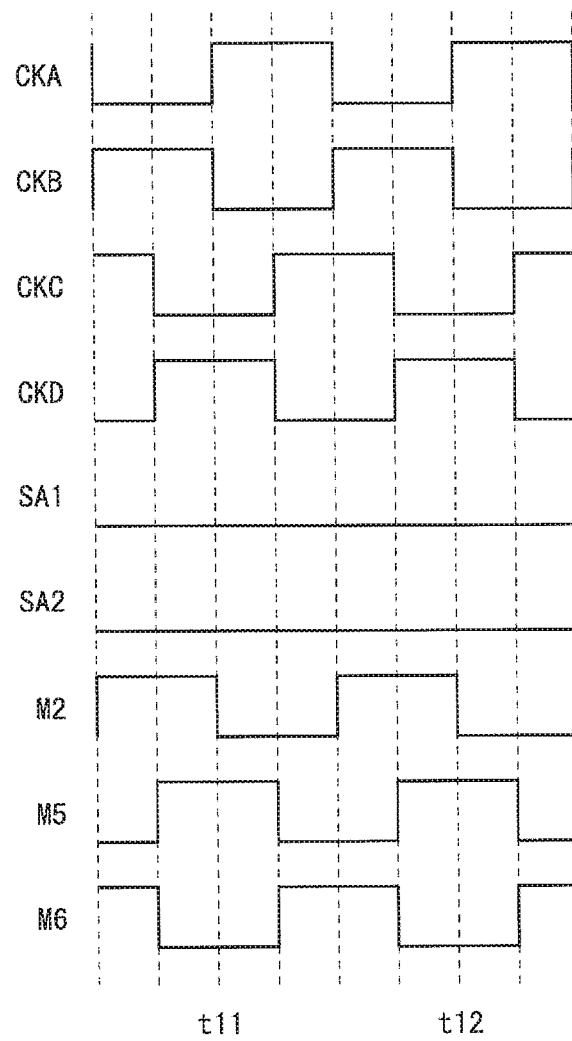
FIG. 12 is a signal waveform diagram for describing operation performed during a normal operation period in the first embodiment.

Next, with reference to FIGS. 1, 10, and 12, operation performed during a normal operation period will be described. FIG. 12 is a signal waveform diagram for describing operation performed during the normal operation period. As described above, to each stage-forming circuit SR is provided the scanning signal GOUT(n−1) outputted from the previous stage, as the first control signal SA1, and is provided the scanning signal GOUT(n+1) outputted from the subsequent stage, as the second control signal SA2. Therefore, as shown in FIG. 12, during the normal operation period, the first control signal SA1 and the second control signal SA2 are maintained at a low level (VSS potential). Meanwhile, the first clock CKA changes from a low level to a high level every predetermined period during the normal operation period. Therefore, at time point t11 and time point t12 in FIG. 12, the potential of the output control node NA can fluctuate due to a parasitic capacitance of the thin film transistor M1. That is, during the normal operation period, the potential of the output control node NA can go into a floating state every predetermined period. However, during a period during which the third clock CKC is at a high level, since the thin film transistor M6 goes into an on state, the potential of the output control node NA is drawn to the VSS potential. In addition, during a period during which the fourth clock CKD is at a high level, since the thin film transistor M5 goes into an on state, the potential of the output control node NA is drawn to the VSS potential. By the above, during the normal operation period, even when noise caused by the clock operation of the first clock CKA is mixed in the output control node NA, the potential of the output control node NA is maintained at the VSS potential. Note that during a period during which the second clock CKB is at a high level, the thin film transistor M2 goes into an on state and the potential of the output terminal 40 (the potential of the scanning signal GOUT) is drawn to the VSS potential.

<1.5 Effects>

According to the present embodiment, each stage-forming circuit SR forming the shift register 410 in the gate driver 400 is provided with the output control node stabilization portion 420 composed of two thin film transistors (the thin film transistor M5 configured such that the drain terminal thereof is connected to the output control node NA, the fourth clock CKD is provided to the gate terminal thereof, and the scanning signal outputted from the previous stage is provided to the source terminal thereof as the first control signal SA1; and the thin film transistor M6 configured such that the drain terminal thereof is connected to the output control node NA, the third clock CKC is provided to the gate terminal thereof, and the scanning signal outputted from the subsequent stage is provided to the source terminal thereof as the second control signal SA2). In such a configuration, during the normal operation period, the thin film transistor M5 and the thin film transistor M6 alternately go into the on state based on the clock operation of the third clock CKC and the fourth clock CKD, with the first control signal SA1 and the second control signal SA2 being at the low level. By this, during the normal operation period, even when noise caused by the clock operation of the clock signal (first clock CKA) is mixed in the output control node NA, the potential of the output control node NA is drawn to the VSS potential. Note that during the write operation period, the first control signal SA1 is at the high level when the fourth clock CKD is at the high level, and the second control signal SA2 is at the high level when the third clock CKC is at the high level. Therefore, a decrease in the potential of the output control node NA during the write operation period due to the provision of the thin film transistors M5 and M6 does not occur.

Figure 27:
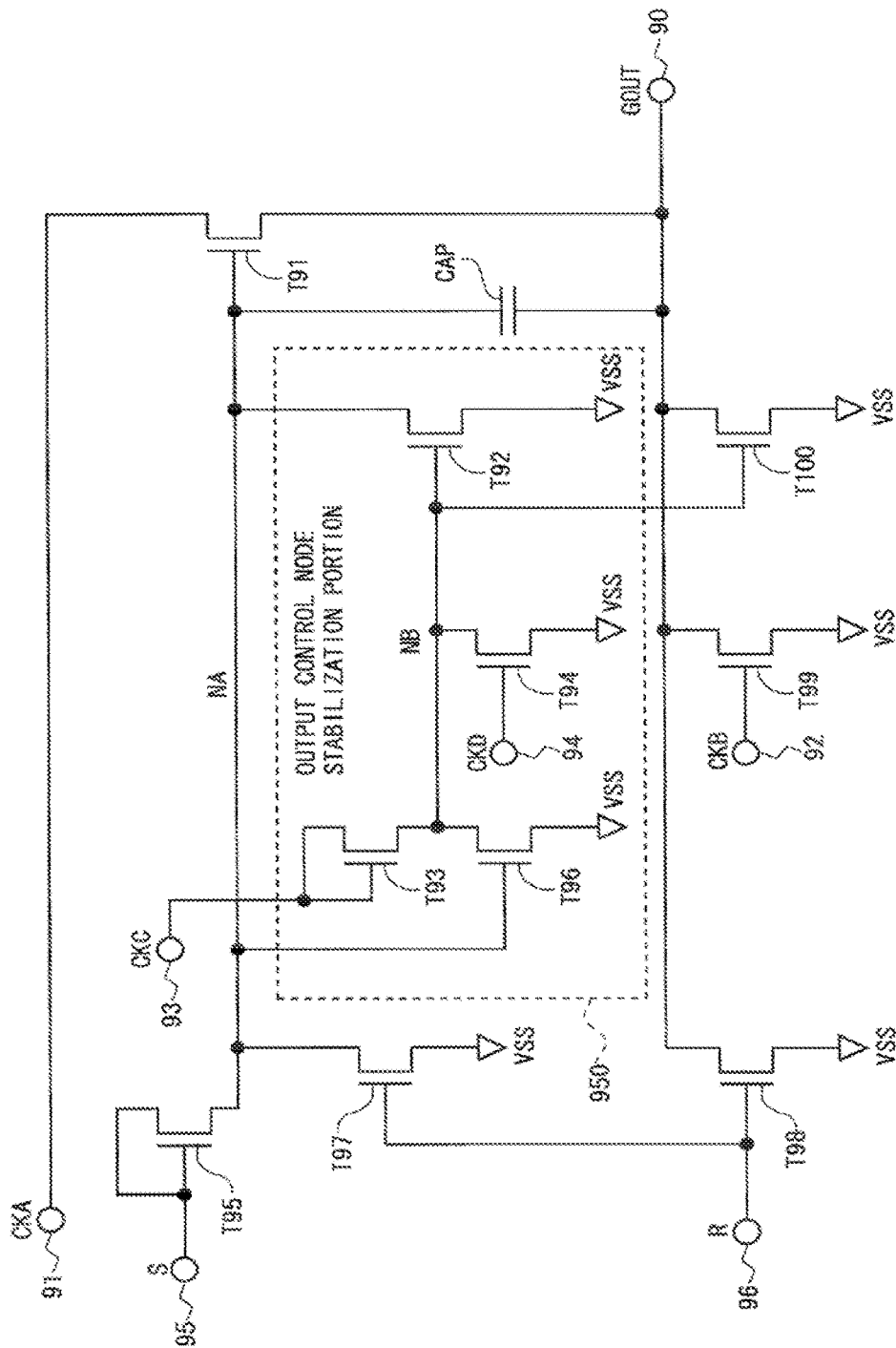
FIG. 27 is a circuit diagram showing a configuration of a stage-forming circuit disclosed in WO 2011/067641 A.
Figure 28:
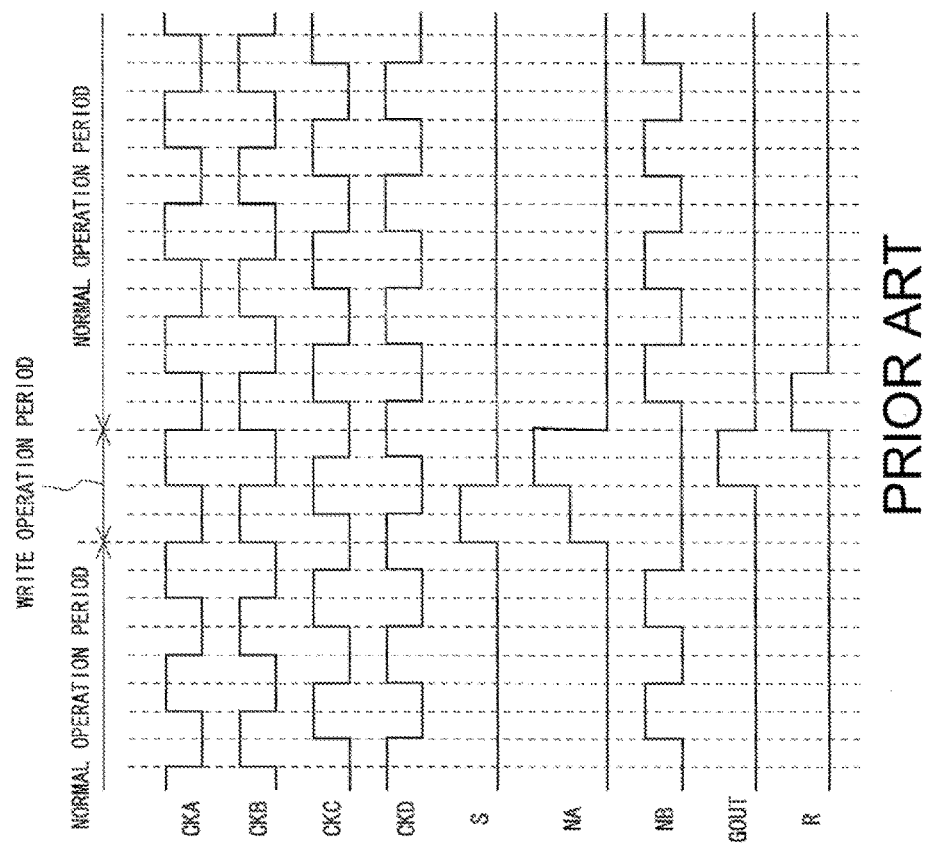
FIG. 28 is a signal waveform diagram for describing the operation of the stage-forming circuit having the configuration shown in FIG. 27.

Meanwhile, according to conventional art, the output control node stabilization portion 950 is implemented using many thin film transistors (e.g., four thin film transistors in the conventional configuration shown in FIG. 27). In this regard, in the present embodiment, the output control node stabilization portion 420 is implemented using only two thin film transistors M5 and M6 as shown in FIG. 1. Therefore, the area occupied by the gate driver 400 on the TFT substrate can be reduced, enabling to achieve a reduction in picture-frame over conventional cases. In addition, since the number of thin film transistors forming the output control node stabilization portion is reduced, the loads of thin film transistors connected to the output control node NA are reduced, and accordingly, reliability for long term operation improves over conventional cases. Furthermore, unlike the conventional configuration, a flow-through current does not flow through the thin film transistors. Hence, power consumption is reduced over conventional cases.

As described above, according to the present embodiment, a gate driver (scanning signal line drive circuit) is implemented that is capable of achieving a reduction in picture-frame and a reduction in power consumption of a display device while ensuring reliability for long term operation.

2. Second Embodiment

A second embodiment of the present invention will be described. Note that only differences from the above-described first embodiment will be described.

<2.1 Overall Configuration and Configuration of a Gate Driver>

Figure 13:
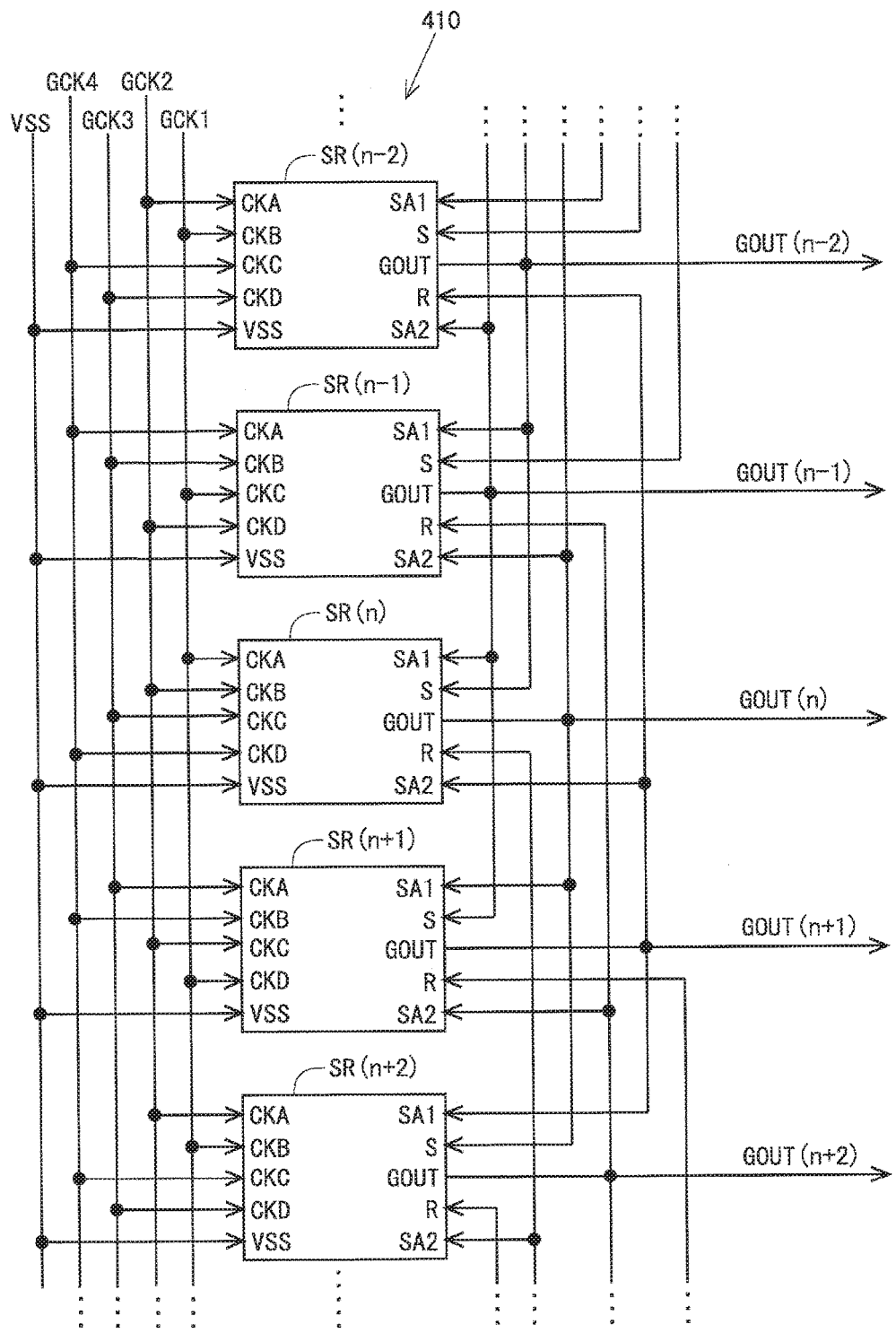
FIG. 13 is a block diagram showing a configuration of a shift register in a gate driver of a second embodiment in the present invention.
Figure 14:
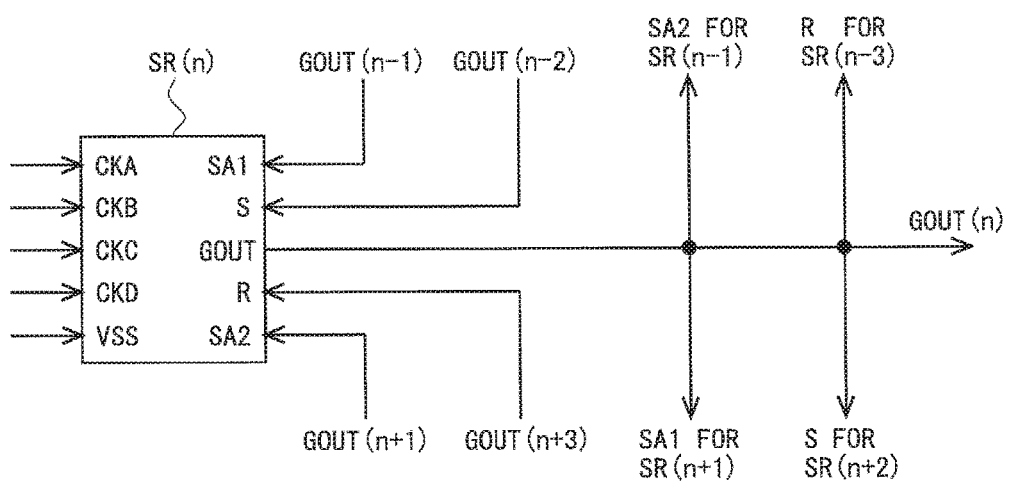
FIG. 14 is a diagram for describing input and output signals to/from a stage-forming circuit of an nth stage of the shift register in the second embodiment.

Overall configuration is the same as the configuration of the first embodiment (see FIG. 2) and thus description thereof is omitted. FIG. 13 is a block diagram showing a configuration of a shift register 410 in a gate driver 400 in the present embodiment. In the first embodiment, to each stage-forming circuit SR is provided the scanning signal outputted from the previous stage, as the set signal S. In the present embodiment, on the other hand, to each stage-forming circuit SR is provided a scanning signal outputted from a stage two stages before the stage-forming circuit SR, as the set signal S. That is, as shown in FIG. 14, for any stage (here, an nth stage), a scanning signal GOUT(n−1) outputted from the previous stage SR(n−1) is provided as the first control signal SA1, a scanning signal GOUT(n−2) outputted from a stage SR(n−2) two stages before the nth stage is provided as the set signal S, a scanning signal GOUT(n+1) outputted from the subsequent stage SR(n+1) is provided as the second control signal SA2, and a scanning signal GOUT(n+3) outputted from a stage SR(n+3) three stages after the nth stage is provided as the reset signal R. In addition, as shown in FIG. 14, a scanning signal GOUT(n) outputted from any stage (here, the nth stage) is provided to a stage SR(n−3) three stages before the nth stage as the reset signal R, provided to the previous stage SR(n−1) as the second control signal SA2, provided to the subsequent stage SR(n+1) as the first control signal SA1, and provided to a stage SR(n+2) two stages after the nth stage as the set signal S, in addition to being provided to a corresponding gate bus line.

<2.2 Configuration of the Stage-Forming Circuit>

Figure 15:
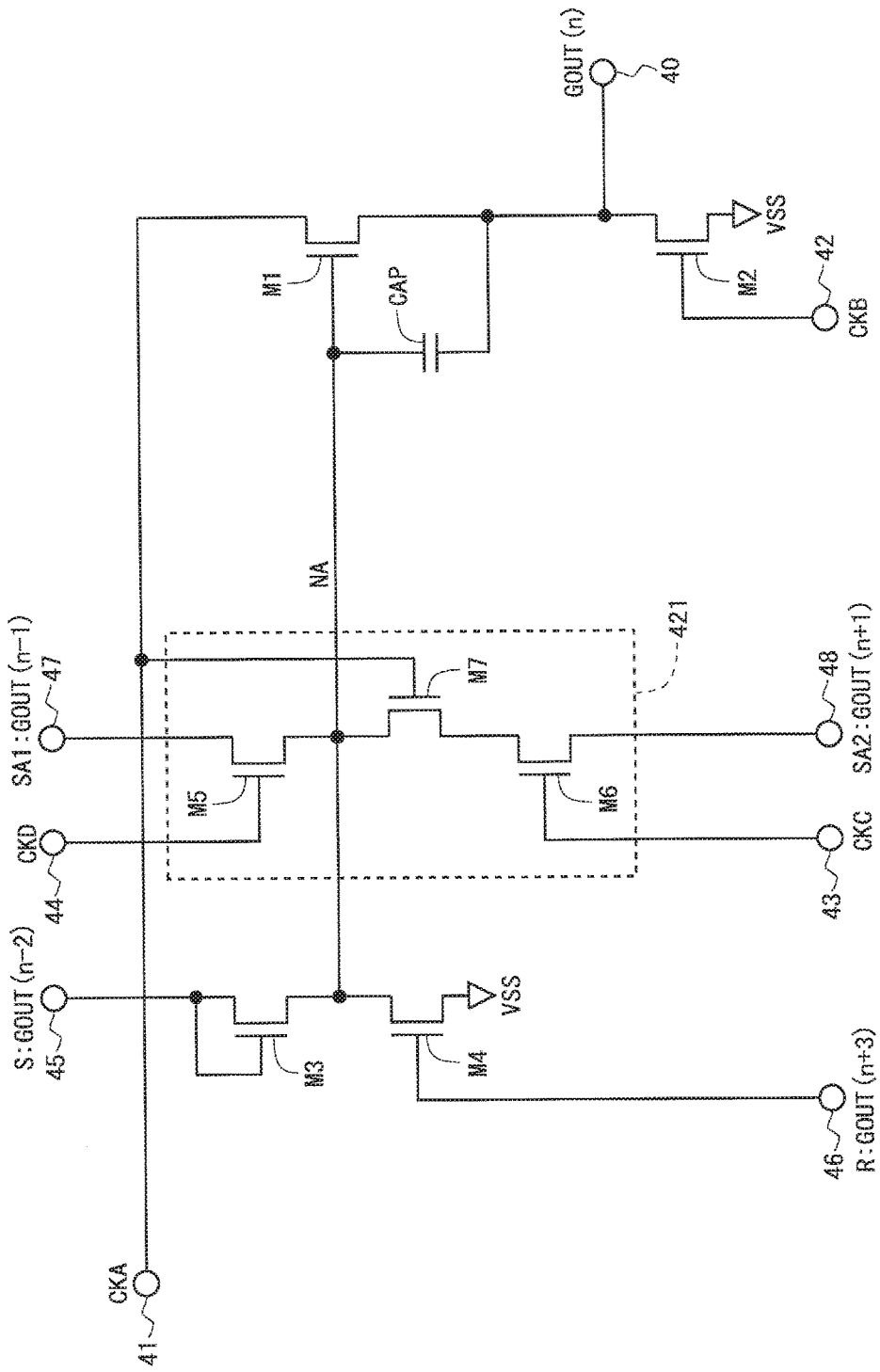
FIG. 15 is a circuit diagram showing a configuration of a stage-forming circuit (a configuration of a portion of the shift register for one stage) in the second embodiment.

FIG. 15 is a circuit diagram showing a configuration of a stage-forming circuit SR (a configuration of a portion of the shift register 410 for one stage) in the present embodiment. As can be grasped from FIGS. 15 and 1, in the present embodiment, a thin film transistor M7 is provided between the output control node NA and the thin film transistor M6, in addition to the components in the first embodiment. The thin film transistor M7 is connected at its gate terminal to the input terminal 41, connected at its drain terminal to the output control node NA, and connected at its source terminal to the drain terminal of the thin film transistor M6. In addition, in the present embodiment, the drain terminal of the thin film transistor M6 is connected to the source terminal of the thin film transistor M7. In addition, in the present embodiment, the scanning signal GOUT(n−2) outputted from a stage SR(n−2) two stages before the stage-forming circuit SR is provided to the input terminal 45, as the set signal S.

Note that, in the present embodiment, an output control node stabilization portion 421 is implemented by the thin film transistor M5, the thin film transistor M6, and the thin film transistor M7.

<2.3 Operation of the Stage-Forming Circuit>

Figure 16:
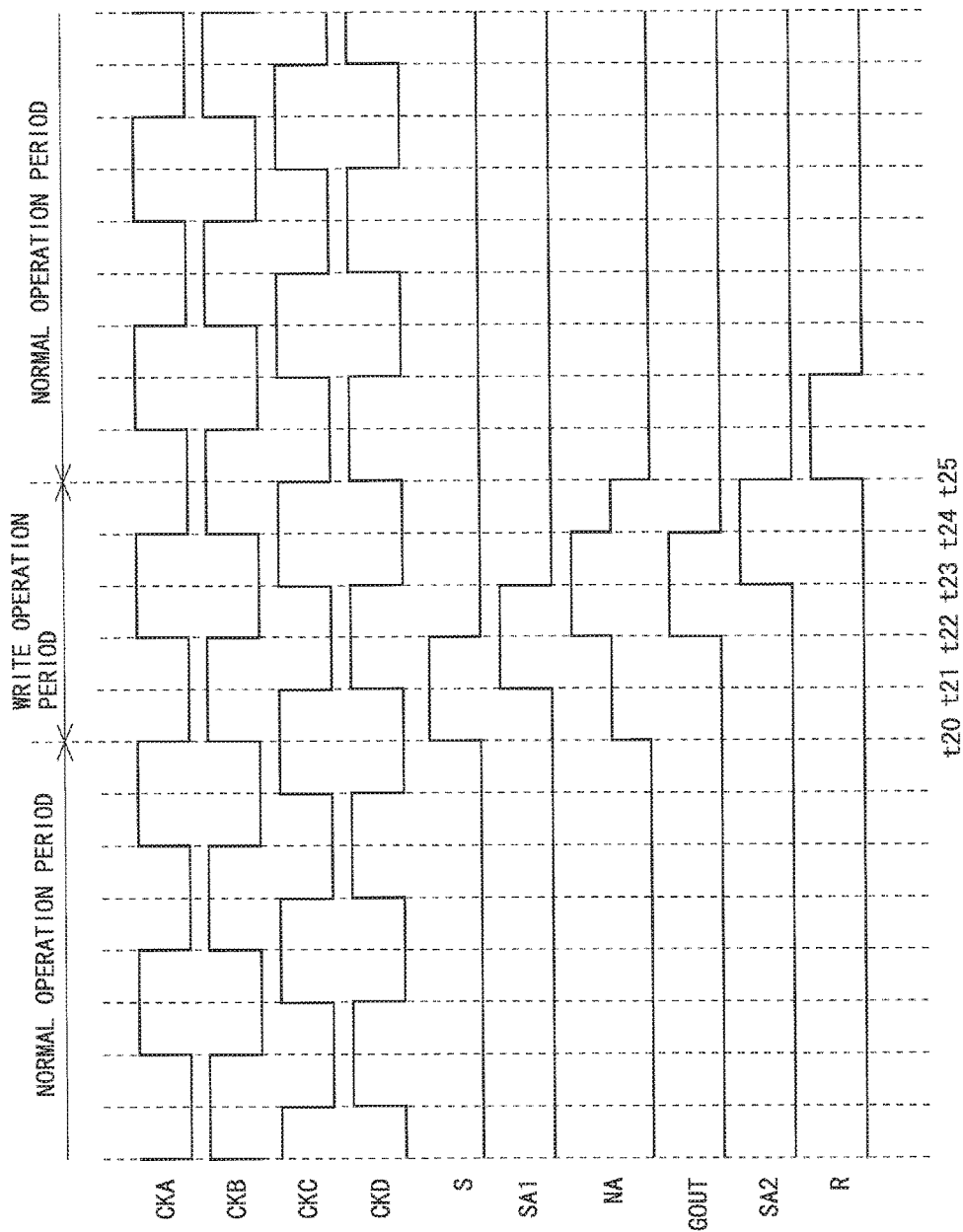
FIG. 16 is a signal waveform diagram for an overall operation period of a liquid crystal display device in the second embodiment.
Figure 17:
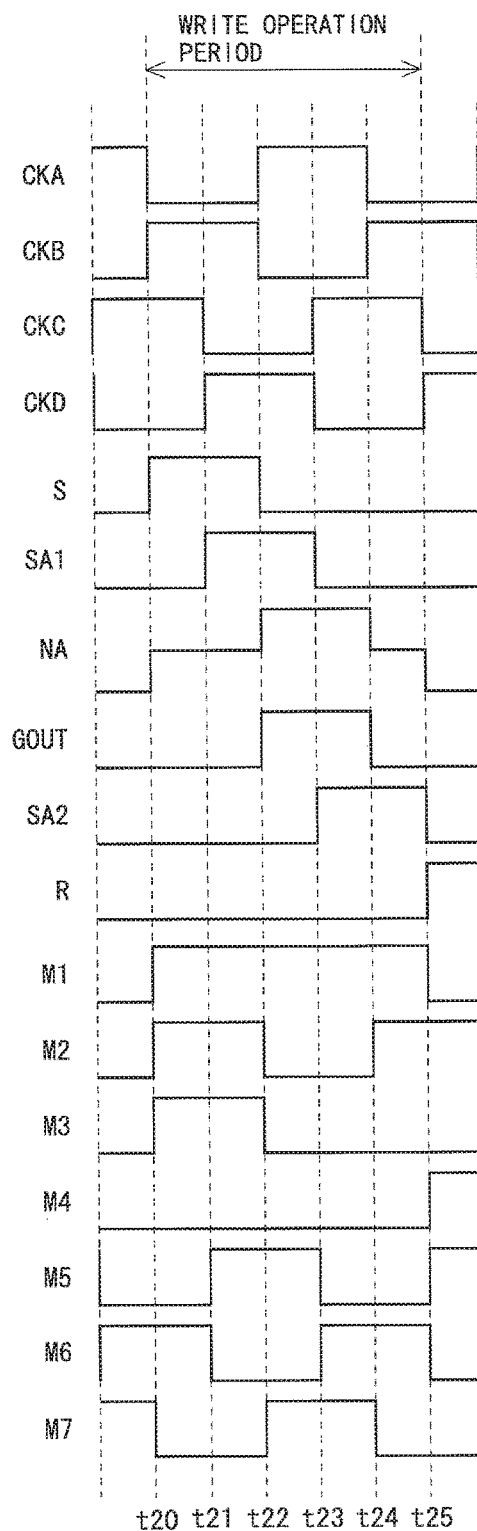
FIG. 17 is a signal waveform diagram for describing operation performed during a write operation period in the second embodiment.

Next, the operation of the stage-forming circuit SR in the present embodiment will be described. First, with reference to FIGS. 15, 16, and 17, operation performed during a write operation period will be described. FIG. 16 is a signal waveform diagram for an overall operation period of a liquid crystal display device. FIG. 17 is a signal waveform diagram for describing operation performed during the write operation period.

At time point t20, the set signal S changes from a low level to a high level. Since the thin film transistor M3 is diode-connected as shown in FIG. 15, the thin film transistor M3 goes into an on state by a pulse of the set signal S, and the potential of the output control node NA increases. By this, the thin film transistor M1 goes into an on state. Here, during a period from time point t20 to time point t21, the reset signal R, the fourth clock CKD, and the first clock CKA are at a low level. Hence, during this period, the thin film transistor M4, the thin film transistor M5, and the thin film transistor M7 are maintained in an off state. Therefore, the potential of the output control node NA does not decrease during this period.

At time point t21, the fourth clock CKD changes from the low level to a high level. By this, the thin film transistor M5 goes into an on state. At this time, the first control signal SA1 is at a high level. In addition, during a period from time point t21 to time point t22, the reset signal R and the first clock CKA are at the low level. Hence, during this period, the thin film transistor M4 and the thin film transistor M7 are maintained in the off state. By the above, during this period, the potential of the output control node NA is maintained at a potential obtained immediately before time point t21.

At time point t22, the first clock CKA changes from the low level to a high level. At this time, since the thin film transistor M1 is in the on state, with an increase in the potential of the input terminal 41, the potential of the output terminal 40 also increases. Here, since a capacitor CAP is provided between the output control node NA and the output terminal 40 as shown in FIG. 15, with the increase in the potential of the output terminal 40, the potential of the output control node NA also increases (the output control node NA is bootstrapped). As a result, a large voltage is applied to the gate terminal of the thin film transistor M1, and the potential of the scanning signal GOUT increases to a level sufficient for a gate bus line connected to the output terminal 40 of this stage-forming circuit SR to go into a selected state. Here, during a period from time point t22 to time point t24, since the second clock CKB is at a low level, a thin film transistor M2 is maintained in an off state. Therefore, the potential of the scanning signal GOUT does not decrease during this period. In addition, during the period from time point t22 to time point t24, since the reset signal R is at the low level, the thin film transistor M4 is maintained in the off state. Therefore, the potential of the output control node NA does not decrease during this period.

Meanwhile, during a period from time point t22 to time point t23, since the fourth clock CKD is at the high level, the thin film transistor M5 is in the on state. However, during this period, since the first control signal SA1 (the scanning signal outputted from the previous stage) is at the high level, a decrease in the potential of the output control node NA due to the thin film transistor M5 being in the on state does not occur. In addition, during a period from time point t23 to time point t24, since both the third clock CKC and the first clock CKA are at a high level, both the thin film transistor M6 and the thin film transistor M7 are in an on state. However, during this period, since the second control signal SA2 (the scanning signal outputted from the subsequent stage) is at a high level, a decrease in the potential of the output control node NA due to both the thin film transistor M6 and the thin film transistor M7 being in the on state does not occur.

At time point t24, the first clock CKA changes from the high level to the low level. By this, the potential of the output terminal 40 decreases with a decrease in the potential of the input terminal 41. When the potential of the output terminal 40 decreases, the potential of the output control node NA also decreases through the capacitor CAP. In addition, at time point t24, the second clock CKB changes from the low level to a high level. By this, the thin film transistor M2 goes into an on state. As a result, the potential of the scanning signal GOUT goes to a low level.

At time point t25, the reset signal R changes from the low level to a high level. By this, the thin film transistor M4 goes into an on state. In addition, at time point t25, the fourth clock CKD changes from the low level to the high level. By this, the thin film transistor M5 goes into the on state. At this time, the first control signal SA1 is at a low level. By the above, at time point t25, the potential of the output control node NA goes to a low level.

By each stage-forming circuit SR performing operation such as that described above, a plurality of gate bus lines GL1 to GLi provided to the liquid crystal display device sequentially go into a selected state, and writing to pixel capacitances is performed row by row.

Figure 18:
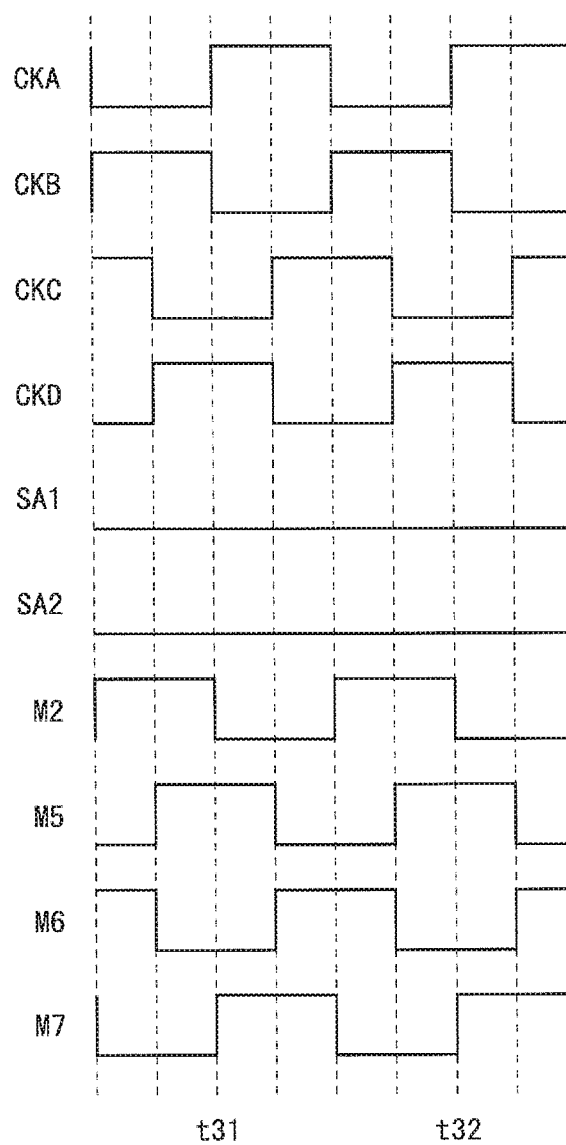
FIG. 18 is a signal waveform diagram for describing operation performed during a normal operation period in the second embodiment.

Next, with reference to FIGS. 15, 16, and 18, operation performed during a normal operation period will be described. FIG. 18 is a signal waveform diagram for describing operation performed during the normal operation period. As described above, to each stage-forming circuit SR is provided the scanning signal GOUT(n−1) outputted from the previous stage, as the first control signal SA1, and is provided the scanning signal GOUT(n+1) outputted from the subsequent stage, as the second control signal SA2. Therefore, as shown in FIG. 18, during the normal operation period, the first control signal SA1 and the second control signal SA2 are maintained at a low level (VSS potential). Meanwhile, the first clock CKA changes from a low level to a high level every predetermined period during the normal operation period. Therefore, at time point t31 and time point t32 in FIG. 18, the potential of the output control node NA can fluctuate due to a parasitic capacitance of the thin film transistor M1. That is, during the normal operation period, the potential of the output control node NA can go into a floating state every predetermined period. However, during a period during which both the third clock CKC and the first clock CKA are at a high level, since both the thin film transistor M6 and the thin film transistor M7 go into an on state, the potential of the output control node NA is drawn to the VSS potential. In addition, during a period during which the fourth clock CKD is at a high level, since the thin film transistor M5 goes into an on state, the potential of the output control node NA is drawn to the VSS potential. By the above, as in the first embodiment, during the normal operation period, even when noise caused by the clock operation of the first clock CKA is mixed in the output control node NA, the potential of the output control node NA is maintained at the VSS potential.

<2.4 Effects>

According to the present embodiment, in addition to the same effects as those of the first embodiment, an effect such as that shown below can be obtained. In the present embodiment, the input terminal 48 for receiving the scanning signal GOUT(n+1) outputted from the subsequent stage is electrically connected to the output control node NA when both the thin film transistor M6 and the thin film transistor M7 are in the on state. Therefore, if the first clock CKA is at the low level even when the third clock CKC is at the high level, then the thin film transistor M7 goes into the off state, and thus, the input terminal 48 and the output control node NA are maintained in a state of being electrically disconnected from each other. Since the stage-forming circuit SR has such a configuration, a period for precharging the output control node NA can be increased compared to that of the first embodiment. Specifically, each stage-forming circuit SR can use a scanning signal GOUT(n−2) outputted from a stage two stages before the stage-forming circuit SR, as the set signal S for precharging the output control node NA. Since the precharge period for the output control node NA increases in this manner, reliability for long term operation improves.

3. Third Embodiment

<3.1 Configuration>

Figure 19:
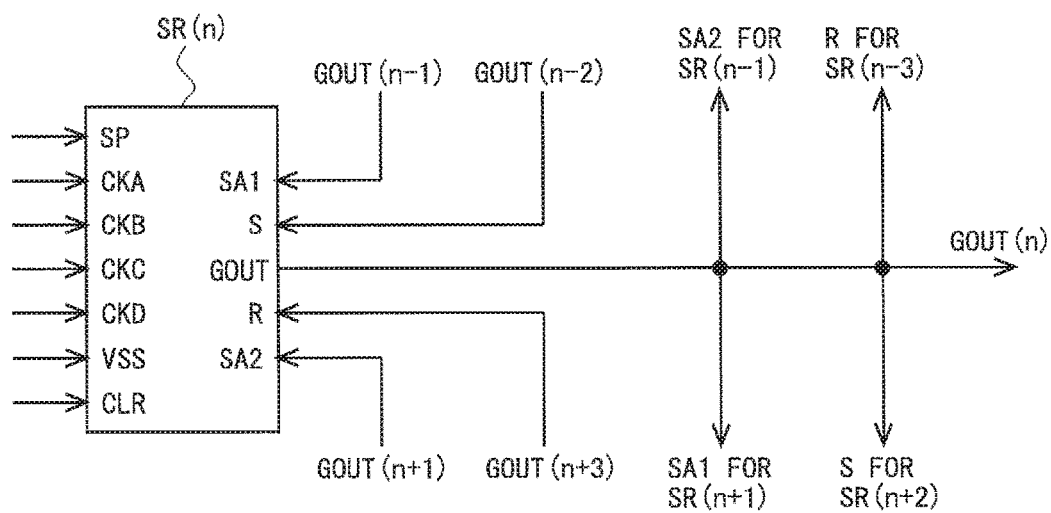
FIG. 19 is a diagram for describing input and output signals to/from a stage-forming circuit of an nth stage of a shift register in a third embodiment of the present invention.

A third embodiment of the present invention will be described. Overall configuration is the same as the configuration of the first embodiment (see FIG. 2) and thus description thereof is omitted. A configuration of a shift register 410 in a gate driver 400 differs from that of the second embodiment in that each stage-forming circuit SR is provided with an input terminal for receiving an initialization signal (a signal for initializing an internal state of each stage-forming circuit SR immediately after the start of a vertical scanning period) SP, and an input terminal for receiving a clear signal (a signal for clearing the internal state of each stage-forming circuit SR when the vertical scanning period ends) CLR. Specifically, each stage-forming circuit SR in the present embodiment is, as shown in FIG. 19, provided with an input terminal for receiving the first clock CKA, an input terminal for receiving the second clock CKB, an input terminal for receiving the third clock CKC, an input terminal for receiving the fourth clock CKD, an input terminal for receiving the low-level direct-current power supply potential VSS, an input terminal for receiving the set signal S, an input terminal for receiving the reset signal R, an input terminal for receiving the first control signal SA1, an input terminal for receiving the second control signal SA2, an input terminal for receiving the initialization signal SP, an input terminal for receiving the clear signal CLR, and an output terminal for outputting the scanning signal GOUT.

Figure 20:
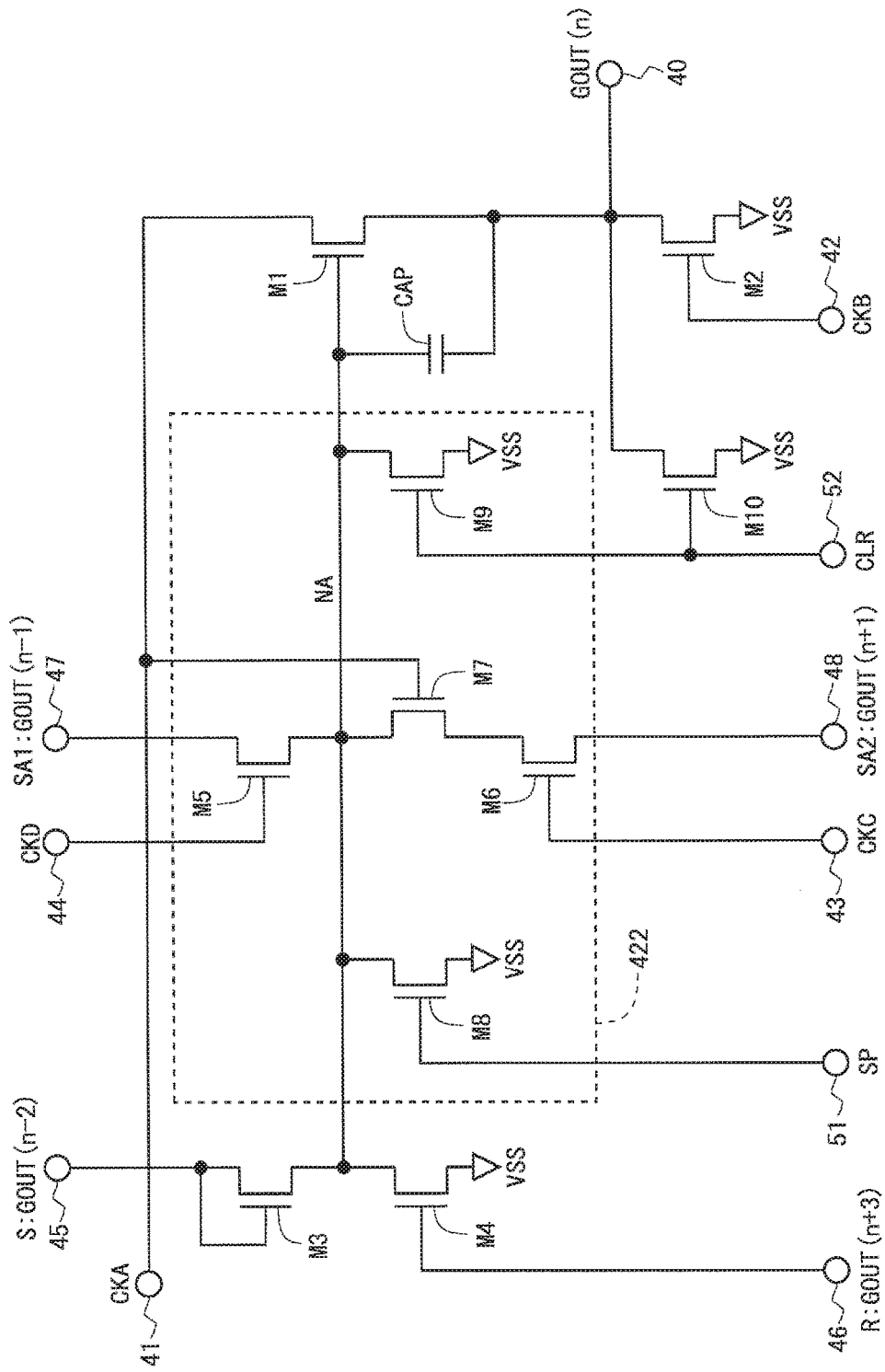
FIG. 20 is a circuit diagram showing a configuration of a stage-forming circuit (a configuration of a portion of the shift register for one stage) in the third embodiment.

FIG. 20 is a circuit diagram showing a configuration of a stage-forming circuit SR (a configuration of a portion of the shift register 410 for one stage) in the present embodiment. As can be grasped from FIGS. 20 and 15, in the present embodiment, a thin film transistor M8, a thin film transistor M9, and a thin film transistor M10 are provided in addition to the components of the second embodiment. Note that in FIG. 20 an input terminal that receives the initialization signal SP is denoted by reference character 51, and an input terminal that receives the clear signal CLR is denoted by reference character 52.

The thin film transistor M8 is connected at its gate terminal to the input terminal 51, connected at its drain terminal to the output control node NA, and connected at its source terminal to the input terminal for the direct-current power supply potential VSS. The thin film transistor M9 is connected at its gate terminal to the input terminal 52, connected at its drain terminal to the output control node NA, and connected at its source terminal to the input terminal for the direct-current power supply potential VSS. The thin film transistor M10 is connected at its gate terminal to the input terminal 52, connected at its drain terminal to the output terminal 40, and connected at its source terminal to the input terminal for the direct-current power supply potential VSS.

The thin film transistor M8 changes the potential of the output control node NA to the VSS potential when the initialization signal SP is at a high level. The thin film transistor M9 changes the potential of the output control node NA to the VSS potential when the clear signal CLR is at a high level. The thin film transistor M10 changes the potential of the output terminal 40 (the potential of the scanning signal GOUT) to the VSS potential when the clear signal CLR is at a high level.

Note that, in the present embodiment, an output control node stabilization portion 422 is implemented by the thin film transistors M5 to M9, and a second output node stabilization switching element is implemented by the thin film transistor M10.

<3.2 Operation>

Next, the operation of the stage-forming circuit SR in the present embodiment will be described. To the stage-forming circuit SR in the present embodiment is provided, as the initialization signal SP, a signal that goes to a high level only for a predetermined period immediately after the start of a vertical scanning period, and is provided, as the clear signal CLR, a signal that goes to a high level only for a predetermined period when the vertical scanning period ends. Therefore, the same operation as that of the second embodiment is performed, except immediately after the start of the vertical scanning period and except when the vertical scanning period ends.

Figure 21:
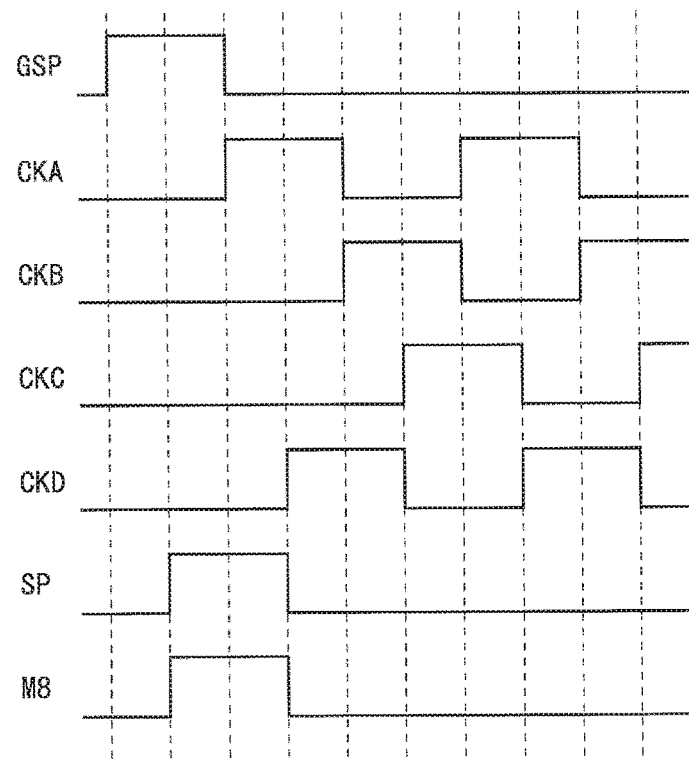
FIG. 21 is a signal waveform diagram for describing operation performed immediately after the start of a vertical scanning period in the third embodiment.

FIG. 21 is a signal waveform diagram for describing operation performed immediately after the start of the vertical scanning period. In the present embodiment, as shown in FIG. 21, the initialization signal SP changes from a low level to a high level immediately after the vertical scanning period is started by a rise of a gate start pulse signal GSP. By this, the thin film transistor M8 goes into an on state, and the potential of the output control node NA is drawn to the VSS potential. Note that for a stage where precharging of the output control node NA is to be performed based on the set signal S, there is a need to prevent the potential of the output control node NA from decreasing through the thin film transistor M8.

Figure 22:
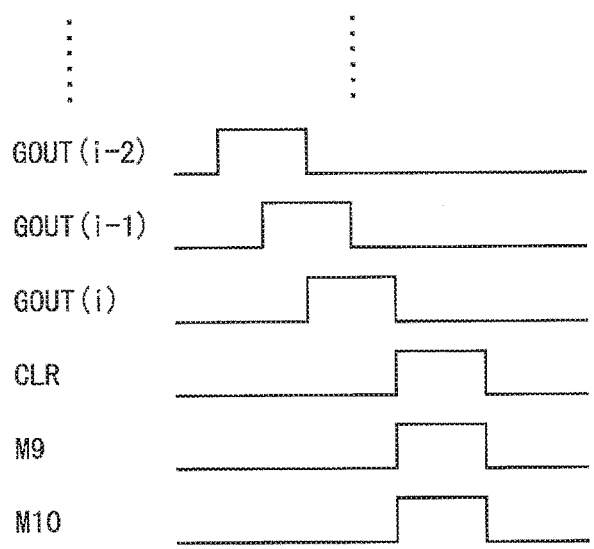
FIG. 22 is a signal waveform diagram for describing operation performed when the vertical scanning period ends in the third embodiment.

FIG. 22 is a signal waveform diagram for describing operation performed when the vertical scanning period ends. In the present embodiment, as shown in FIG. 22, after sequentially applying active scanning signals GOUT to all gate bus lines GL1 to GLi during each vertical scanning period, the clear signal CLR changes from a low level to a high level. By this, the thin film transistor M9 and the thin film transistor M10 go into an on state. By the thin film transistor M9 going into an on state, the potential of the output control node NA is drawn to the VSS potential. In addition, by the thin film transistor M10 going into an on state, the potential of the output terminal 40 (the potential of the scanning signal GOUT) is drawn to the VSS potential.

Note that for timing at which the initialization signal SP rises, different timing than that shown in FIG. 21 may be used as long as an increase in the potential of the output control node NA due to a rise of the first clock CKA immediately after the start of the vertical scanning period can be suppressed. Note also that for timing at which the clear signal CLR rises, different timing than that shown in FIG. 22 may be used as long as the timing is between when writing to pixel capacitances is performed in the last row and when the next vertical scanning period starts.

<3.3 Effects>

According to the present embodiment, in each stage-forming circuit SR, even when noise is mixed in the output control node NA immediately after the start of the vertical scanning period due to a rise of the first clock CKA before a rise of the third clock CKC or the fourth clock CKD, the potential of the output control node NA is drawn to the VSS potential by the thin film transistor M8 going into the on state. By this, the occurrence of abnormal operation due to the clock operation of the first clock CKA immediately after the start of the vertical scanning period is suppressed. In addition, when the vertical scanning period ends, the potential of the output control node NA and the potential of the output terminal 40 (the potential of the scanning signal GOUT) are drawn to the VSS potential by the thin film transistor M9 and the thin film transistor M10 going into the on state. By this, the internal state of each stage-forming circuit SR is cleared every frame, improving the reliability of the liquid crystal display device.

<3.4 Variants>

Figure 23:
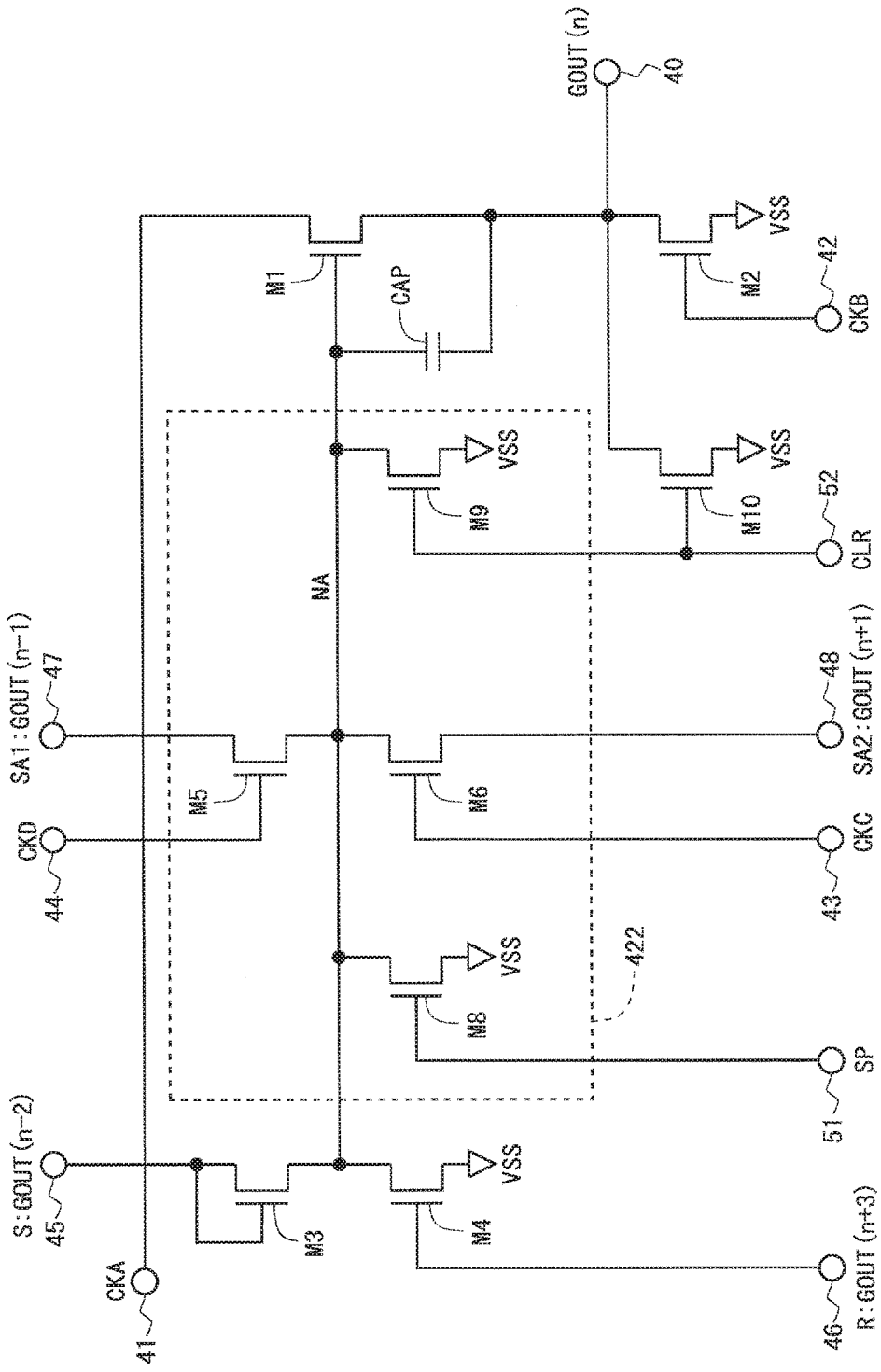
FIG. 23 is a circuit diagram showing a configuration of a stage-forming circuit (a configuration of a portion of a shift register for one stage) in a variant of the third embodiment.
Figure 24:
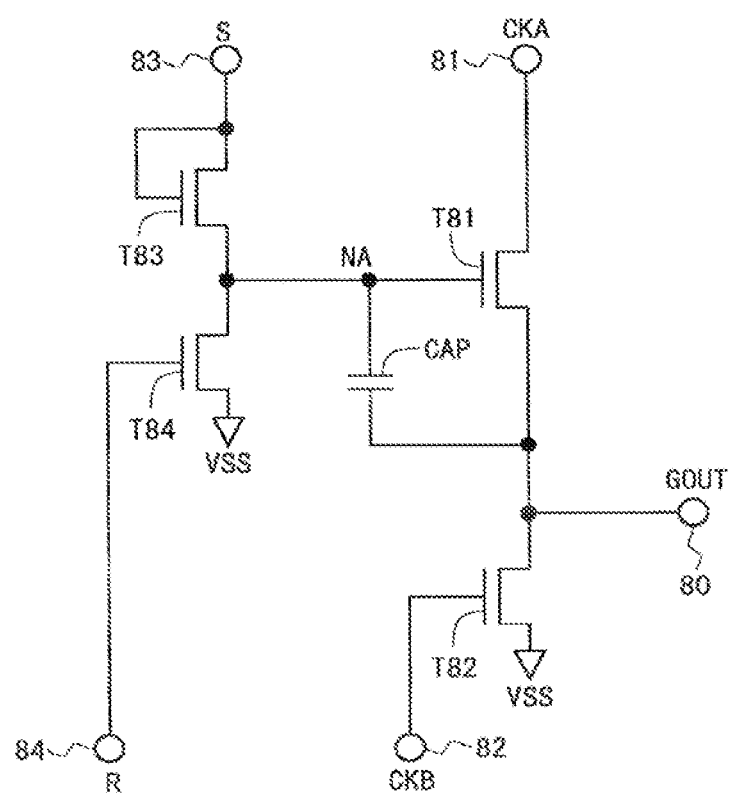
FIG. 24 is a circuit diagram of a conventional stage-forming circuit having the simplest configuration.
Figure 25:
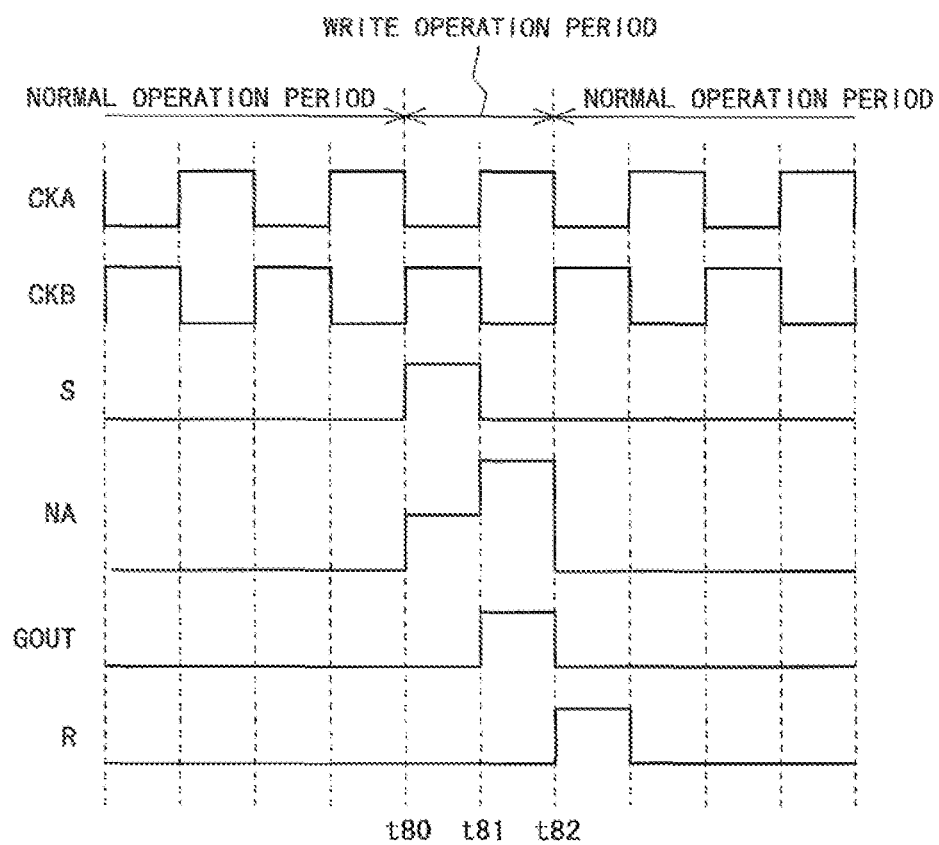
FIG. 25 is a signal waveform diagram for describing the operation of the stage-forming circuit having the configuration shown in FIG. 24.
Figure 26:
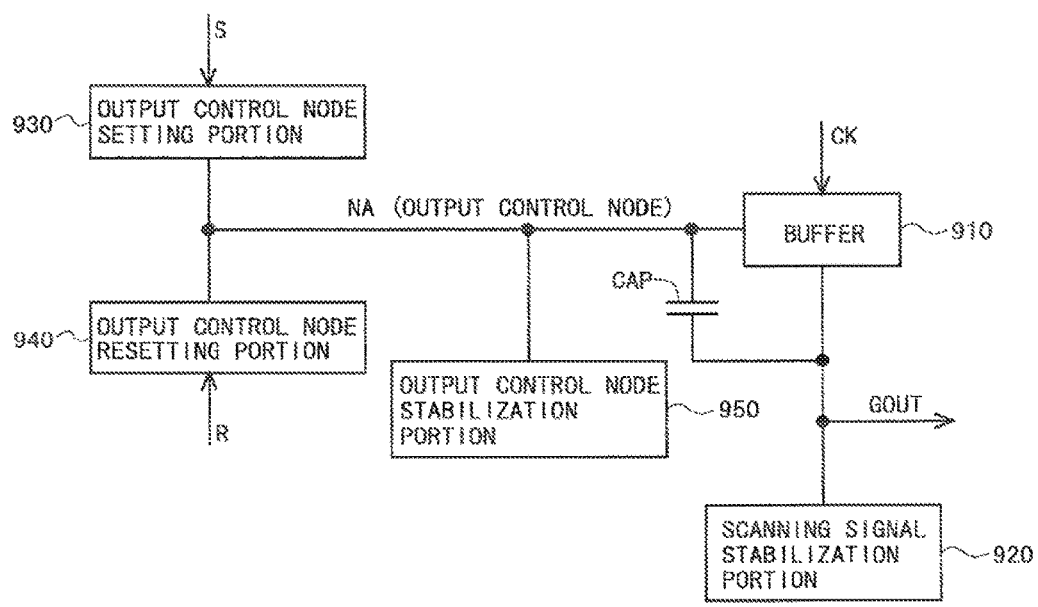
FIG. 26 is a diagram schematically showing a configuration of a stage-forming circuit having an output control node stabilization portion.

Although, in the present embodiment, the thin film transistors M8 to M10 are provided in addition to the components of the second embodiment (see FIG. 15), a configuration provided with thin film transistors M8 to M10 in addition to the components of the first embodiment (see FIG. 1) as shown in FIG. 23 may be employed. Note, however, that in the case of the configuration shown in FIG. 23, the precharge period for the output control node NA cannot be increased. Therefore, considering reliability for long term operation, it is preferred to employ the configuration shown in FIG. 20.

In addition, though effects are lesser than in the third embodiment, a configuration can also be employed in which only one or two of the thin film transistors M8 to M10 is (are) provided in addition to the components of the first embodiment or the components of the second embodiment.

4. Others

Although a liquid crystal display device is described as an example in the embodiments, the present invention is not limited thereto. The present invention can also be applied to other display devices such as an organic EL (Electro Luminescence) display device.

DESCRIPTION OF REFERENCE CHARACTERS

40: OUTPUT TERMINAL (OF A STAGE-FORMING CIRCUIT)
41 to 48, 51, and 52: INPUT TERMINAL (OF A STAGE-FORMING CIRCUIT)
300: SOURCE DRIVER (VIDEO SIGNAL LINE DRIVE CIRCUIT)
400: GATE DRIVER (SCANNING SIGNAL LINE DRIVE CIRCUIT)
410: SHIFT REGISTER
600: DISPLAY UNIT
SR and SR(1) to SR(i): STAGE-FORMING CIRCUIT
CAP: CAPACITOR (CAPACITIVE ELEMENT)
M1 to M10: THIN FILM TRANSISTOR
NA: OUTPUT CONTROL NODE
GL1 to GLi: GATE BUS LINE
SL1 to SLj: SOURCE BUS LINE
GCK: GATE CLOCK SIGNAL
CKA, CKB, CKC, and CKD: FIRST CLOCK, SECOND CLOCK, THIRD CLOCK, AND FOURTH CLOCK
S: SET SIGNAL
R: RESET SIGNAL
SA1: FIRST CONTROL SIGNAL
SA2: SECOND CONTROL SIGNAL
GOUT and GOUT(1) to GOUT(i): SCANNING SIGNAL
VSS: LOW-LEVEL DIRECT-CURRENT POWER SUPPLY POTENTIAL

The invention claimed is:

1. A shift register that includes a plurality of stages and drives scanning signal lines of a display device, each of the plurality of stages operating based on a plurality of clock signals, and each of the plurality of clock signals periodically repeating a first level and a second level, wherein
a stage-forming circuit that forms each of the plurality of stages includes:
an output node that outputs a scanning signal to a corresponding one of the scanning signal lines;
a first output node stabilization switching element having a control terminal to which one of the plurality of clock signals is provided; a first conductive terminal connected to the output node; and a second conductive terminal to which an off-level power supply potential is provided, the one of the plurality of clock signals changing from an off level to an on level at timing at which the scanning signal outputted from the output node is to change from an on level to an off level;
an output control switching element having a control terminal; a first conductive terminal to which one of the plurality of clock signals is provided; and a second conductive terminal connected to the output node, the one of the plurality of clock signals changing from an off level to an on level at timing at which the scanning signal outputted from the output node is to change from an off level to an on level;
an output control node connected to the control terminal of the output control switching element;
an output control node turn-on portion that receives, as a set signal, one of scanning signals outputted from output nodes of stages one or more stages before the stage, and changes a level of the output control node to an on level based on the set signal, the one of scanning signals changing from an off level to an on level at timing at which the output control node is to change from an off level to an on level;
an output control node turn-off portion that receives, as a reset signal, one of scanning signals outputted from output nodes of stages one or more stages after the stage, and changes the level of the output control node to an off level based on the reset signal, the one of scanning signals changing from an off level to an on level at timing at which the output control node is to change from an on level to an off level; and
an output control node stabilization portion that prevents the level of the output control node from fluctuating during a period during which the level of the output control node is to be maintained at an off level, and
the output control node stabilization portion includes:
a first output control node stabilization switching element having a control terminal to which one of the plurality of clock signals is provided; a first conductive terminal connected to the output control node; and a second conductive terminal to which a scanning signal outputted from an output node of a previous stage is provided, the one of the plurality of clock signals changing from an off level to an on level at timing at which the scanning signal outputted from the output node of the previous stage is to change from an off level to an on level;
a second output control node stabilization switching element having a control terminal to which one of the plurality of clock signals is provided; a first conductive terminal connected to the output control node directly or through another switching element and a second conductive terminal to which a scanning signal outputted from an output node of a subsequent stage is provided, the one of the plurality of clock signals changing from an off level to an on level at timing at which the scanning signal outputted from the output node of the subsequent stage is to change from an off level to an on level; and a third output control node stabilization switching element having a control terminal to which the clock signal provided to the first conductive terminal of the output control switching element is provided; a first conductive terminal connected to the output control node; and a second conductive terminal connected to the first conductive terminal of the second output control node stabilization switching element.

2. The shift register according to claim 1, wherein the output control node turn-on portion receives, as the set signal, a scanning signal outputted from an output node of a stage two stages before the stage.

3. The shift register according to claim 1, wherein the output control node stabilization portion further includes a fourth output control node stabilization switching element having a control terminal to which an initialization signal is provided; a first conductive terminal connected to the output control node; and a second conductive terminal to which an off-level power supply potential is provided, the initialization signal changing from an off level to an on level immediately after a start of a vertical scanning period.

4. The shift register according to claim 1, wherein the output control node stabilization portion further includes a fifth output control node stabilization switching element having a control terminal to which a clear signal is provided; a first conductive terminal connected to the output control node; and a second conductive terminal to which an off-level power supply potential is provided, the clear signal changing from an off level to an on level when a vertical scanning period ends.

5. The shift register according to claim 1, wherein the stage-forming circuit further includes a second output node stabilization switching element having a control terminal to which a clear signal is provided; a first conductive terminal connected to the output node; and a second conductive terminal to which an off-level power supply potential is provided, the clear signal changing from an off level to an on level when a vertical scanning period ends.

6. A display device comprising:
a display unit in which a plurality of scanning signal lines are arranged; and
the shift register according to claim 1, the shift register including a plurality of stages which are provided so as to have a one-to-one correspondence with the plurality of scanning signal lines.

7. The shift register according to claim 1, wherein the switching elements included in the stage-forming circuit are thin-film transistors including an oxide semiconductor.

8. The shift register according to claim 7, wherein the oxide semiconductor is indium gallium zinc oxide.

9. A shift register that includes a plurality of stages and drives scanning signal lines of a display device, each of the plurality of stages operating based on a plurality of clock signals, and each of the plurality of clock signals periodically repeating a first level and a second level, wherein a stage-forming circuit that forms each of the plurality of stages includes:

an output node that outputs a scanning signal to a corresponding one of the scanning signal lines;

a first output node stabilization switching element having a control terminal to which one of the plurality of clock signals is provided; a first conductive terminal connected to the output node; and a second conductive terminal to which an off-level power supply potential is provided, the one of the plurality of clock signals changing from an off level to an on level at timing at which the scanning signal outputted from the output node is to change from an on level to an off level;

an output control switching element having a control terminal; a first conductive terminal to which one of the plurality of clock signals is provided; and a second conductive terminal connected to the output node, the one of the plurality of clock signals changing from an off level to an on level at timing at which the scanning signal outputted from the output node is to change from an off level to an on level;

an output control node connected to the control terminal of the output control switching element;

an output control node turn-on portion that receives, as a set signal, one of scanning signals outputted from output nodes of stages one or more stages before the stage, and changes a level of the output control node to an on level based on the set signal, the one of scanning signals changing from an off level to an on level at timing at which the output control node is to change from an off level to an on level;

an output control node turn-off portion that receives, as a reset signal, one of scanning signals outputted from output nodes of stages one or more stages after the stage, and changes the level of the output control node to an off level based on the reset signal, the one of scanning signals changing from an off level to an on level at timing at which the output control node is to change from an on level to an off level;

an output control node stabilization portion that prevents the level of the output control node from fluctuating during a period during which the level of the output control node is to be maintained at an off level; and a second output node stabilization switching element having a control terminal to which a clear signal is provided; a first conductive terminal connected to the output node; and a second conductive terminal to which an off-level power supply potential is provided, the clear signal changing from an off level to an on level when a vertical scanning period ends, and the output control node stabilization portion includes:
a first output control node stabilization switching element having a control terminal to which one of the plurality of clock signals is provided; a first conductive terminal connected to the output control node; and a second conductive terminal to which a scanning signal outputted from an output node of a previous stage is provided, the one of the plurality of clock signals changing from an off level to an on level at timing at which the scanning signal outputted from the output node of the previous stage is to change from an off level to an on level;

a second output control node stabilization switching element having a control terminal to which one of the plurality of clock signals is provided; a first conductive terminal connected to the output control node directly or through another switching element and a second conductive terminal to which a scanning signal outputted from an output node of a subsequent stage is provided, the one of the plurality of clock signals changing from an off level to an on level at timing at which the scanning signal outputted from the output node of the subsequent stage is to change from an off level to an on level;

a third output control node stabilization switching element having a control terminal to which the clock signal provided to the first conductive terminal of the output control switching element is provided; a first conductive terminal connected to the output control node; and a second conductive terminal connected to the first conductive terminal of the second output control node stabilization switching element;

a fourth output control node stabilization switching element having a control terminal to which an initialization signal is provided; a first conductive terminal connected to the output control node; and a second conductive terminal to which an off-level power supply potential is provided, the initialization signal changing from an off level to an on level immediately after a start of a vertical scanning period; and a fifth output control node stabilization switching element having a control terminal to which the clear signal is provided; a first conductive terminal connected to the output control node; and a second conductive terminal to which an off-level power supply potential is provided, the clear signal changing from an off level to an on level when the vertical scanning period ends.

10. The shift register according to claim 9, wherein the switching elements included in the stage-forming circuit are thin-film transistors including an oxide semiconductor.

11. The shift register according to claim 10, wherein the oxide semiconductor is indium gallium zinc oxide.

12. A display device comprising:

a display unit in which a plurality of scanning signal lines is arranged; and the shift register according to claim 9, the shift register including a plurality of stages which is provided so as to have a one-to-one correspondence with the plurality of scanning signal lines.

* * * * *